(12) United States Patent
Yamawaku et al.

(10) Patent No.: US 9,583,312 B2
(45) Date of Patent: Feb. 28, 2017

(54) FILM FORMATION DEVICE, SUBSTRATE PROCESSING DEVICE, AND FILM FORMATION METHOD

(71) Applicant: Tokyo Electron Limited, Tokyo (JP)

(72) Inventors: Jun Yamawaku, Yamanashi (JP); Chishio Koshimizu, Yamanashi (JP); Yohei Yamazawa, Yamanashi (JP); Mitsuhiro Tachibana, Iwate (JP); Hitoshi Kato, Iwate (JP); Takeshi Kobayashi, Iwate (JP); Shigehiro Miura, Iwate (JP); Takafumi Kimura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/100,224

(22) Filed: Dec. 9, 2013

(65) Prior Publication Data

US 2014/0170859 A1    Jun. 19, 2014

(30) Foreign Application Priority Data

Dec. 14, 2012    (JP) .................................. 2012-273581

(51) Int. Cl.
*H01L 21/306*    (2006.01)
*C23C 16/00*    (2006.01)
(Continued)

(52) U.S. Cl.
CPC ........ *H01J 37/321* (2013.01); *C23C 16/4584* (2013.01); *C23C 16/45536* (2013.01); *C23C 16/45551* (2013.01); *H01J 37/3211* (2013.01); *H01J 37/3244* (2013.01); *H01J 37/32082* (2013.01); *H01J 37/32651* (2013.01); (Continued)

(58) Field of Classification Search
CPC ................ H01J 37/321; H01J 37/3211; H01J 37/32651; H01J 37/32082; H01J 37/32733; H01J 37/32752
USPC ............. 118/723 I, 723 IR, 730; 156/345.48, 156/345.49, 345.55; 315/111.51
See application file for complete search history.

(56) References Cited

U.S. PATENT DOCUMENTS 5,234,529 A    8/1993  Johnson
5,309,063 A    5/1994  Singh
(Continued)

FOREIGN PATENT DOCUMENTS

CN    1185030    6/1998
CN    1503856    6/2004
(Continued)

*Primary Examiner* — Luz Alejandro Mulero
(74) *Attorney, Agent, or Firm* — IPUSA, PLLC

(57) ABSTRACT

A film formation device to conduct a film formation process for a substrate includes a rotating table, a film formation area configured to include a process gas supply part, a plasma processing part, a lower bias electrode provided at a lower side of a position of a height of the substrate on the rotating table, an upper bias electrode arranged at the same position of the height or an upper side of a position of the height, a high-frequency power source part connected to at least one of the lower bias electrode and the upper bias electrode and configured to form a bias electric potential on the substrate in such a manner that the lower bias electrode and the upper bias electrode are capacitively coupled, and an exhaust mechanism.

9 Claims, 23 Drawing Sheets

(51) Int. Cl.
  *H01J 37/32* (2006.01)
  *H01L 21/02* (2006.01)
  *H01L 21/687* (2006.01)
  *C23C 16/455* (2006.01)
  *C23C 16/458* (2006.01)

(52) U.S. Cl.
  CPC .. *H01J 37/32715* (2013.01); *H01J 37/32733* (2013.01); *H01J 37/32752* (2013.01); *H01L 21/0217* (2013.01); *H01L 21/0228* (2013.01); *H01L 21/02164* (2013.01); *H01L 21/02167* (2013.01); *H01L 21/02211* (2013.01); *H01L 21/02214* (2013.01); *H01L 21/02219* (2013.01); *H01L 21/02274* (2013.01); *H01L 21/68764* (2013.01); *H01L 21/68771* (2013.01)

(56) References Cited

U.S. PATENT DOCUMENTS

| | | | |
|---|---|---|---|
| 5,540,800 | A | 7/1996 | Qian |
| 5,619,103 | A * | 4/1997 | Tobin et al. ............. 315/111.21 |
| 6,000,360 | A | 12/1999 | Koshimizu |
| 6,024,826 | A * | 2/2000 | Collins et al. ............ 156/345.37 |
| 6,042,687 | A | 3/2000 | Singh et al. |
| 6,149,760 | A * | 11/2000 | Hama ...................... 156/345.48 |
| 6,213,050 | B1 * | 4/2001 | Liu et al. ................. 118/723 IR |
| 6,232,236 | B1 * | 5/2001 | Shan ................. H01J 37/32082 156/345.51 |
| 6,322,661 | B1 | 11/2001 | Bailey, III et al. |
| 6,417,626 | B1 * | 7/2002 | Brcka et al. ............. 315/111.51 |
| 6,451,161 | B1 | 9/2002 | Jeng et al. |
| 6,869,641 | B2 | 3/2005 | Schmitt |
| 6,905,625 | B2 | 6/2005 | Okumura et al. |
| 6,935,269 | B2 | 8/2005 | Lee et al. |
| 7,153,542 | B2 | 12/2006 | Nguyen et al. |
| 7,232,767 | B2 | 6/2007 | George et al. |
| 2001/0037857 | A1 | 11/2001 | Kazumi et al. |
| 2002/0092618 | A1 | 7/2002 | Collins |
| 2002/0129903 | A1 | 9/2002 | Davis et al. |
| 2004/0050329 | A1 | 3/2004 | Ikeda |
| 2004/0058293 | A1 | 3/2004 | Nguyen et al. |
| 2004/0163595 | A1 | 8/2004 | Edamura et al. |
| 2005/0022933 | A1 * | 2/2005 | Howard ............ H01J 37/32165 156/345.47 |
| 2006/0177579 | A1 * | 8/2006 | Shin et al. ................. 427/248.1 |
| 2007/0102119 | A1 | 5/2007 | Ikeda |
| 2008/0026162 | A1 | 1/2008 | Dickey et al. |
| 2010/0062602 | A1 * | 3/2010 | Sakamoto et al. ............ 438/694 |
| 2010/0136795 | A1 | 6/2010 | Honma |
| 2010/0229797 | A1 | 9/2010 | Kato et al. |
| 2010/0310771 | A1 | 12/2010 | Lee |
| 2011/0048326 | A1 | 3/2011 | Kato et al. |
| 2011/0155057 | A1 * | 6/2011 | Kato et al. ................... 118/719 |
| 2011/0204023 | A1 | 8/2011 | Huh et al. |
| 2012/0021252 | A1 | 1/2012 | Lee |
| 2012/0138450 | A1 | 6/2012 | Davis |
| 2012/0273130 | A1 | 11/2012 | Drewery et al. |
| 2013/0130512 | A1 | 5/2013 | Kato et al. |

FOREIGN PATENT DOCUMENTS

| | | |
|---|---|---|
| CN | 1554114 | 12/2004 |
| CN | 101748389 | 6/2010 |
| CN | 102002685 | 4/2011 |
| CN | 102110572 | 6/2011 |
| JP | 08-213378 | 8/1996 |
| JP | H09-008014 | 1/1997 |
| JP | 3144664 | 3/2001 |
| JP | 2006-522490 | 9/2006 |
| JP | 2007-247066 | 9/2007 |
| JP | 2007-305981 | 11/2007 |
| JP | 2008-130651 | 6/2008 |
| JP | 2008-248281 | 10/2008 |
| JP | 2008-251830 | 10/2008 |
| JP | 2008-288437 | 11/2008 |
| JP | 2009-076876 | 4/2009 |
| JP | 2010-212105 | 9/2010 |
| JP | 2010-239102 | 10/2010 |
| JP | 2010-245448 | 10/2010 |
| JP | 2011-040574 | 2/2011 |
| JP | 2011-071123 | 4/2011 |
| JP | 2011-132589 | 7/2011 |
| JP | 2011-151343 | 8/2011 |
| TW | 201102456 | 1/2011 |
| TW | 201126601 | 8/2011 |
| WO | 2004/090943 | 10/2004 |
| WO | 2011/022612 | 2/2011 |
| WO | 2011-069011 | 6/2011 |

\* cited by examiner

GAS FOR
PLASMA INHIBITION

FILM FORMATION DEVICE, SUBSTRATE PROCESSING DEVICE, AND FILM FORMATION METHOD

CROSS-REFERENCE TO RELATED APPLICATIONS

The present application claims the priority based on Japanese Patent Application No. 2012-273581 filed on Dec. 14, 2012, and the entire contents of Japanese Patent Application No. 2012-273581 are herein incorporated by reference.

BACKGROUND OF THE INVENTION

1. Field of the Invention

An aspect of the present invention relates to a film formation device, a substrate processing device, and a film formation method.

2. Description of the Related Art

For example, an Atomic Layer Deposition (ALD) method using a device as described in Japanese Patent Application Publication No. 2010-239102 has been known for a method for film-forming a thin film, for example, a silicon oxide (SiO$_2$) film or the like, on a substrate such as a semiconductor wafer (that will be referred to as a "wafer" below). In this device, 5 wafers are arranged on a rotating table in a direction along a periphery thereof and a plurality of gas nozzles are arranged at an upper side of this rotating table. Then, a plurality of kinds of reactive gasses that react with one another are sequentially supplied onto each revolving wafer to laminate reaction products.

In order to conduct plasma modification on each reaction product laminated on a wafer in such an ALD method, a device has been known that provides a member for conducting plasma modification at a position separated from a gas nozzle in a peripheral direction like Japanese Patent Application Publication No. 2011-040574. However, in a case where a recess, such as a hole or a groove (trench), having an aspect ratio, for example, greater than tens to hundreds, is formed on a surface of a wafer, a degree of modification in a direction of a depth of this recess may be dispersed.

That is, as a recess with a greater aspect ratio is thus formed, it may be difficult for plasma (in more detail, an argon ion) to approach the recess. Furthermore, a plasma modification process and a film formation process are conducted in a vacuum chamber, and hence, a process pressure in such a vacuum chamber is a pressure that is higher than that of a vacuum atmosphere that could maintain an activity of plasma better. Therefore, when plasma contacts an inner wall surface of a recess, such plasma is readily deactivated, and hence, a degree of modification in a direction of a depth of the recess is readily dispersed thereby. Furthermore, even for a wafer with no recess formed thereon, it may be necessary to form a higher density plasma near the wafer in order to conduct a modification process during one revolution of a rotating table, that is, conduct a modification better in a narrower area between mutually adjacent gas nozzles.

Japanese Patent Application Publication No. 8-213378 describes a device for applying a bias voltage to a lower electrode but does not describe a technique for revolving a wafer by a rotating table.

SUMMARY OF THE INVENTION

According to one aspect of the present invention, there is provided a film formation device configured to conduct a film formation process for a substrate in a vacuum chamber, wherein the film formation device includes a rotating table configured to revolve a substrate mounting area configured to mount the substrate thereon, a film formation area configured to include a process gas supply part configured to supply a process gas to the substrate mounting area and sequentially laminate a molecular layer or an atomic layer on the substrate with rotation of the rotating table to form a thin film, a plasma processing part configured to modification-process the molecular layer or the atomic layer by plasma produced through plasma formation of a gas for plasma generation in a plasma generation area provided separately from the film formation area in a direction of rotation of the rotating table, a lower bias electrode provided at a lower side of a position of a height of the substrate on the rotating table to attract an ion in the plasma to a surface of the substrate, an upper bias electrode arranged at the same position of the height or an upper side of a position of the height, a high-frequency power source part connected to at least one of the lower bias electrode and the upper bias electrode and configured to form a bias electric potential on the substrate in such a manner that the lower bias electrode and the upper bias electrode are capacitively coupled through the plasma generation area, and an exhaust mechanism configured to exhaust a gas in an inside of the vacuum chamber.

According to another aspect of the present invention, there is provided a substrate processing device, including a rotating table provided in a vacuum chamber to revolve a substrate mounting area configured to mount a substrate thereon, a plasma processing part configured to supply plasma produced through plasma formation of a gas for plasma generation to the substrate mounting area to conduct plasma processing for the substrate in a plasma generation area, a lower bias electrode provided at a lower side of a position of a height of the substrate on the rotating table to attract an ion in the plasma on a surface of the substrate, an upper bias electrode arranged at the same position of the height or at an upper side of a position of the height, a high-frequency power source part connected to at least one of the lower bias electrode and the upper bias electrode and configured to form a bias electric potential on the substrate in such a manner that the lower bias electrode and the upper bias electrode are capacitively coupled through the plasma generation area, and an exhaust mechanism configured to exhaust a gas in an inside of the vacuum chamber.

According to another aspect of the present invention, there is provided a film formation method configured to conduct a film formation process for a substrate in a vacuum chamber, wherein the film formation method includes a step of mounting a substrate with a surface with a recess formed thereon in a substrate mounting area on a rotating table and revolving the substrate mounting area, a step of then supplying a process gas for the substrate in the substrate mounting area to film-form a molecular layer or an atomic layer on the substrate, a step of subsequently supplying a gas for plasma generation in a plasma generation area in the vacuum chamber and conducting plasma formation of the gas for plasma generation to conduct a modification process for the molecular layer or the atomic layer by plasma, a step of supplying a power to at least one of a lower bias electrode provided at a lower side of a position of a height of the substrate on the rotating table and an upper bias electrode arranged at the same position of the height or an upper side of a position of the height to capacitively couple the lower bias electrode and the upper bias electrode through the plasma generation area, thereby forming a bias electric potential on the substrate, and attract an ion in the plasma on a surface of the substrate, and a step of exhausting a gas in an inside of the vacuum chamber.

Figure 1:
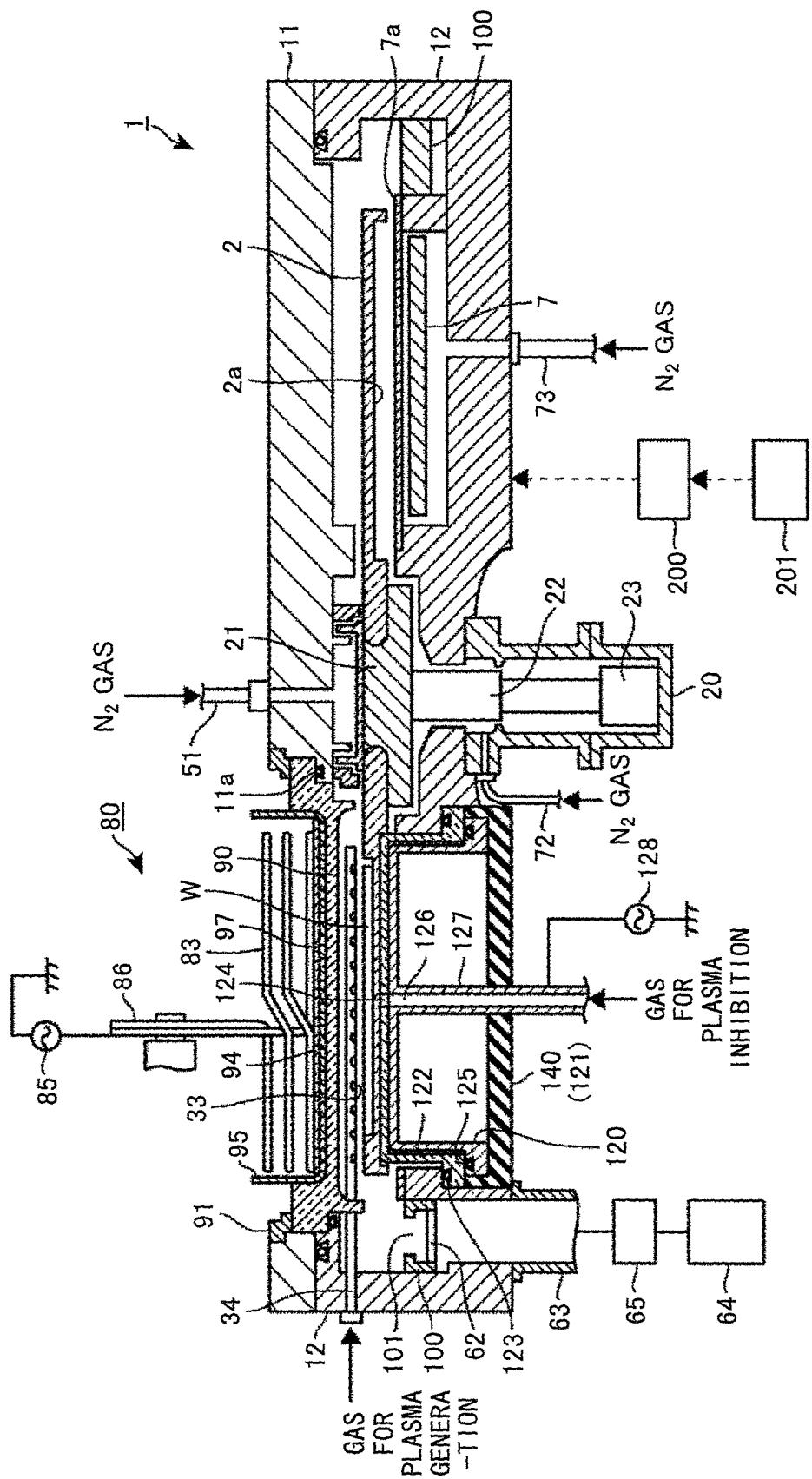
FIG. 1 is a longitudinal sectional view that illustrates one example of a film formation device according to an embodiment of the present invention.

DETAILED DESCRIPTION OF THE PREFERRED EMBODIMENTS (A Film Formation Device, a Substrate Processing Device, and a Film Formation Method)

An embodiment of the present invention relates to a film formation device, substrate processing device, and a film formation method for conducting a plasma process for a substrate.

An object of an embodiment of the present invention is to provide a film formation device, substrate processing device, and a film formation method that are capable of conducting a plasma process with a higher uniformity in a direction of a depth of a recess on a surface of a substrate as a plasma process is conducted for a substrate that is revolved by a rotating table.

A film formation device according to an embodiment of the present invention is a film formation device for conducting a film formation process for a substrate in a vacuum chamber, characterized by including:

a rotating table for revolving a substrate mounting area that mounts a substrate;

a film formation area that includes a process gas supply part that supplies a process gas to the substrate mounting area and is to sequentially laminate a molecular layer or an atomic layer on a substrate with rotation of the rotating table to form a thin film;

a plasma processing part for modification-processing the molecular layer or the atomic layer by plasma produced through plasma formation of a gas for plasma generation in a plasma generation area provided separately from this film formation area in a direction of rotation of the rotating table;

a lower bias electrode provided at a lower side of a position of a height of a substrate on the rotating table to attract an ion in plasma to a surface of a substrate and an upper bias electrode arranged at the same position of the height or an upper side of a position of the height;

a high-frequency power source part connected to at least one of these bias electrodes and being to form a bias electric potential on a substrate in such a manner that the lower bias electrode and the upper bias electrode are capacitively coupled through the plasma generation area; and an exhaust mechanism for exhausting a gas in an inside of the vacuum chamber.

The film formation device may be configured as follows.

The configuration may be such that:

the plasma processing part includes an antenna winding around a vertical axis and connected to a high-frequency power source for plasma generation to generate inductively coupled plasma in a plasma generation area, and the upper bias electrode is provided between the antenna and the plasma generation area and is an electrically conductive plate wherein a plurality of slits formed to intersect a direction of extending of the antenna are arranged along a direction of a length of an antenna to block an electric field of an electromagnetic field formed by the antenna and pass a magnetic field thereof.

The configuration may be such that each of the lower bias electrode and the upper bias electrode is arranged through a gap area for a substrate on the rotating table.

The film formation device may be configured to include:

another process gas supply part provided at a position separated from the process gas supply part in a direction of rotation of a rotating table and being to supply a gas reactive with a process gas supplied from the process gas supply part; and a separation gas supply part for supplying a separation gas to each separation area provided between these processing areas to mutually separate the processing areas supplied with a gas from each of the process gas supply part and the another process gas supply part.

The configuration may be such that the plasma processing part includes a high-frequency power source for plasma generation for conducting plasma formation of a gas for plasma generation and this high-frequency power source for plasma generation is doubled as the high-frequency power source part.

In this case, the plasma processing part may include a pair of opposite electrodes arranged to oppose each other to generate capacitively coupled plasma in the plasma generation area.

A substrate processing device according to an embodiment of the present invention is characterized by including:

a rotating table provided in a vacuum chamber to revolve a substrate mounting area that mounts a substrate thereon;

a plasma processing part for supplying plasma produced through plasma formation of a gas for plasma generation to the substrate mounting area to conduct plasma processing for a substrate in a plasma generation area;

a lower bias electrode provided at a lower side of a position of a height of a substrate on the rotating table to attract an ion in plasma on a surface of a substrate and an upper bias electrode arranged at the same position of the height or at an upper side of a position of the height;

a high-frequency power source part connected to at least one of these bias electrodes and being to form a bias electric potential on a substrate in such a manner that the lower bias electrode and the upper bias electrode are capacitively coupled through the plasma generation area; and an exhaust mechanism for exhausting a gas in an inside of the vacuum chamber.

A film formation method according to an embodiment of the present invention is a film formation method for conducting a film formation process for a substrate in a vacuum chamber, characterized by including:

a step that mounts a substrate with a recess formed on a surface thereof in a substrate mounting area on a rotating table and revolves this substrate mounting area;

a step that then supplies a process gas for a substrate in the substrate mounting area to film-form a molecular layer or an atomic layer on the substrate;

a step that subsequently supplies a gas for plasma generation in a plasma generation area in the vacuum chamber and conducts plasma formation of this gas for plasma generation to conduct a modification process for the molecular layer or the atomic layer by plasma;

a step that supplies a power to at least one of a lower bias electrode provided at a lower side of a position of a height of a substrate on the rotating table and an upper bias electrode arranged at the same position of the height or an upper side of a position of the height to capacitively couple the lower bias electrode and the upper bias electrode through the plasma generation area, thereby forming a bias electric potential on a substrate, and attract an ion in plasma on a surface of the substrate; and a step that exhausts a gas in an inside of the vacuum chamber.

In an embodiment of the present invention, for conducting plasma processing for a substrate that revolves on a rotating table, a lower bias electrode and an upper bias electrode are arranged in such a manner that a bias electric potential is formed on the substrate through an area for positioning a substrate on a rotating table at a lower side of a plasma generation area. Then, a high-frequency electric power is supplied to at least one of these bias electrodes to capacitively couple a lower bias electrode and an upper bias electrode. Accordingly, it may be possible to form a plasma at a higher density near a substrate because an ion in plasma is attracted to a side of a substrate. Therefore, even if a recess with a greater aspect ratio as already described is formed on a surface of a substrate, it is possible to homogenize a degree of plasma processing in a direction of a depth of the recess.

An example of a substrate processing device in an embodiment of the present invention being applied to a film formation device will be described with reference to FIG. 1 to FIG. 9. As illustrated in FIG. 1 to FIG. 4, this device includes a vacuum chamber 1 with a planar shape that is generally a circular shape and a rotating table 2 provided in this vacuum chamber 1 and having a center of rotation at a center of the vacuum chamber 1, and is configured to conduct a film formation process and a plasma modification process for a wafer W. Then, as described below, this film formation device is configured in such a manner that even if, a recess having an aspect ratio of, for example, more than tens to hundreds is formed on a surface of a wafer W, a degree of plasma modification is homogenized in a direction of a depth of the recess by attracting plasma to a side of the wafer W. Next, an outline of an entire device will be described briefly before a Faraday shield 95 or a lower bias electrode 120 that is an essential part of a film formation device according to a first embodiment of the present invention will be described in detail.

A separation gas supply tube 51 for partitioning respective processing areas P1 and P2 by flowing of a separation gas ($N_2$ gas) is connected to a central portion of a top plate 11 of the vacuum chamber 1. As illustrated in FIG. 1, a heater unit 7 that is a heating mechanism is provided at a lower side of the rotating table 2, and a wafer W is heated through the rotating table 2 at a film formation temperature of, for example, 300° C. In FIG. 1, 7a indicates a cover member and 73 indicates a purge gas supply tube.

The rotating table 2 is composed of a dielectric material of, for example, quartz or the like, and is fixed at a central portion thereof to a core part 21 with a generally cylindrical shape. This rotating table 2 is configured rotatably around a vertical axis, in this example, in a clockwise fashion, by a rotating shaft 22 that extends from a bottom surface of the core part 21 to a lower side. FIGS. 1, 23, 20, and 72 indicate a driving part (rotation mechanism) for rotating the rotating shaft 22 around a vertical axis, a case body for storing the rotating shaft 22 and the driving part 23, and a purge gas supply tube, respectively.

Figure 3:
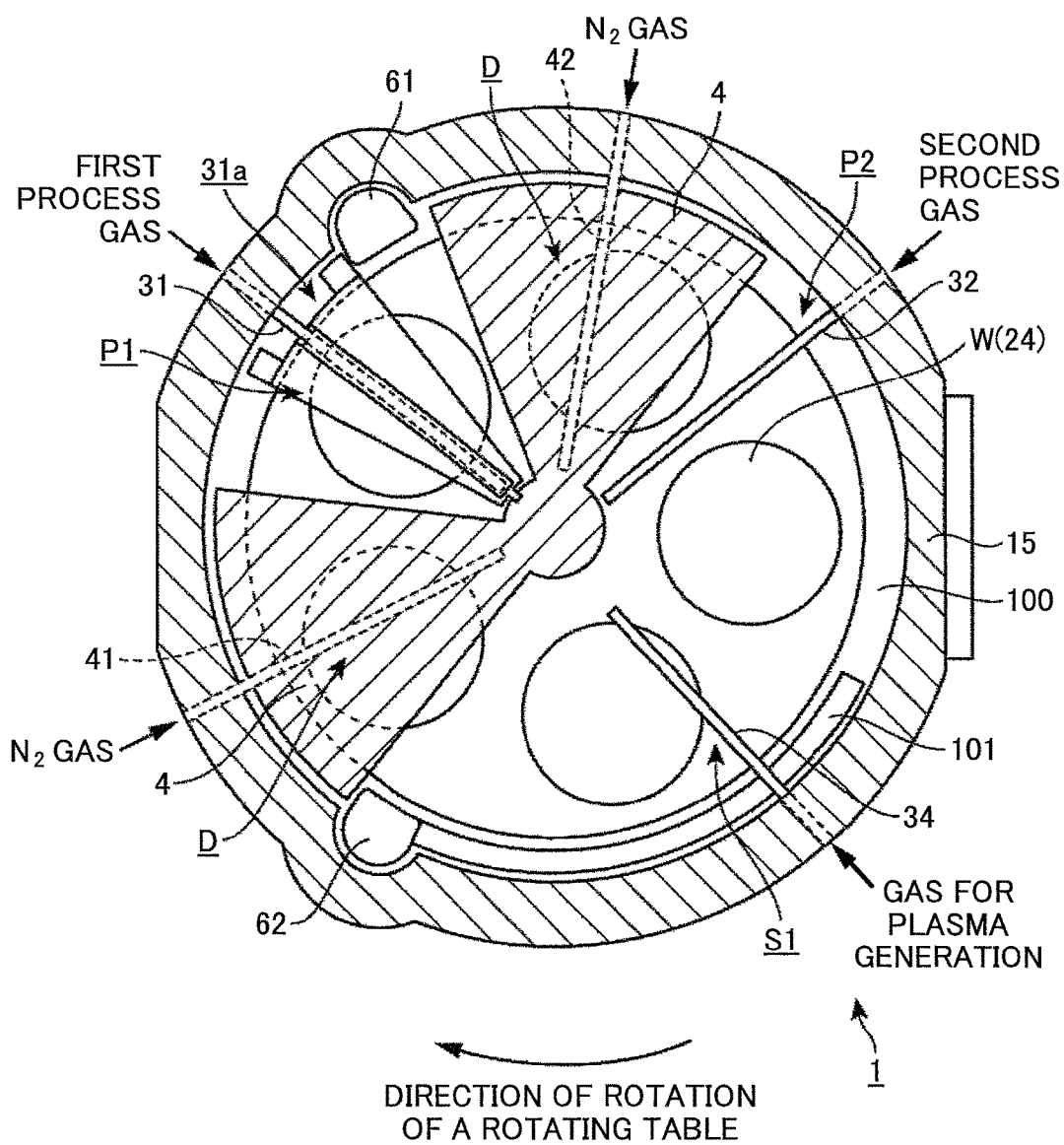
FIG. 3 is a transverse sectional plan view that illustrates the film formation device.
Figure 4:
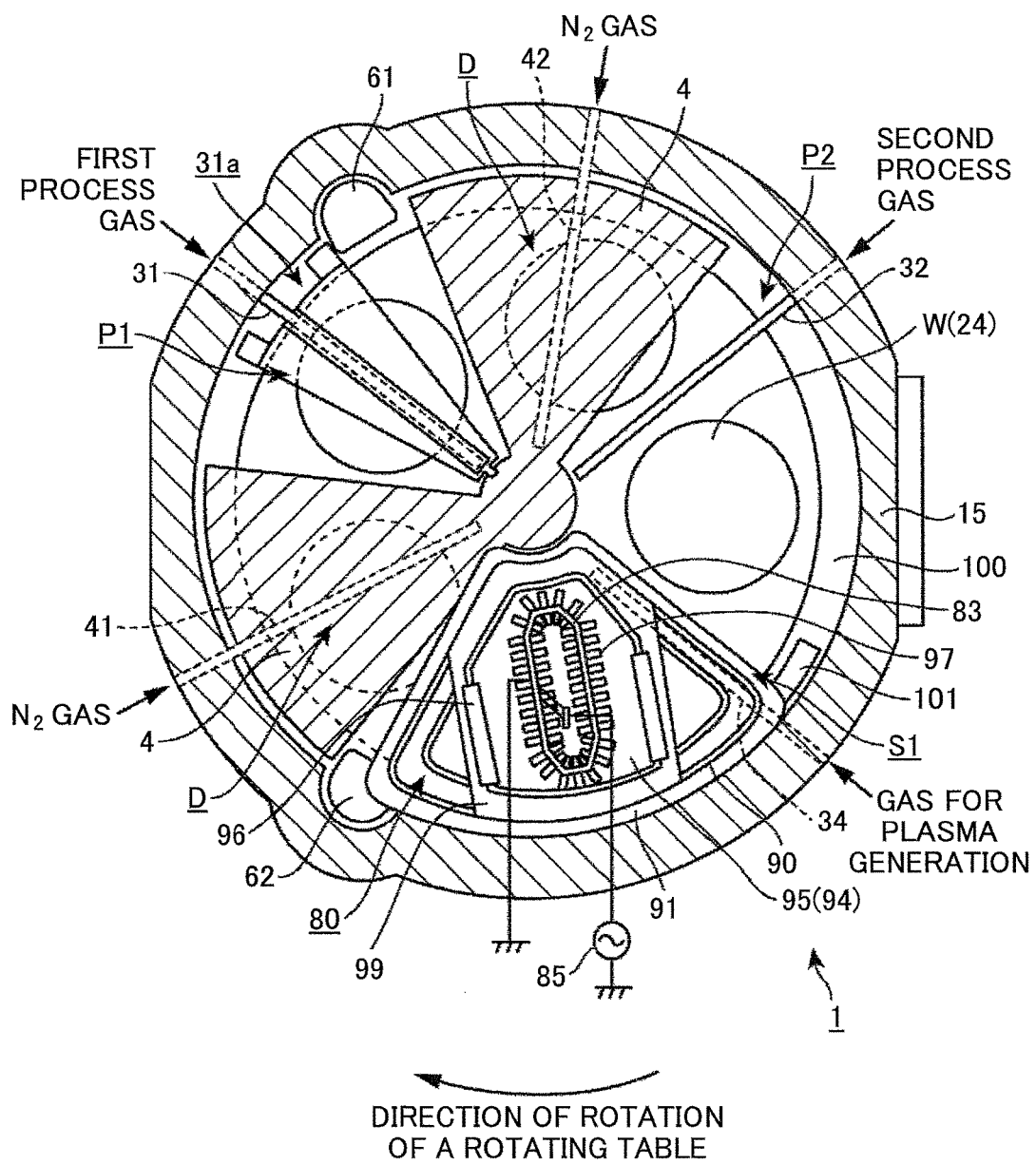
FIG. 4 is a transverse sectional plan view that illustrates the film formation device.
Figure 5:
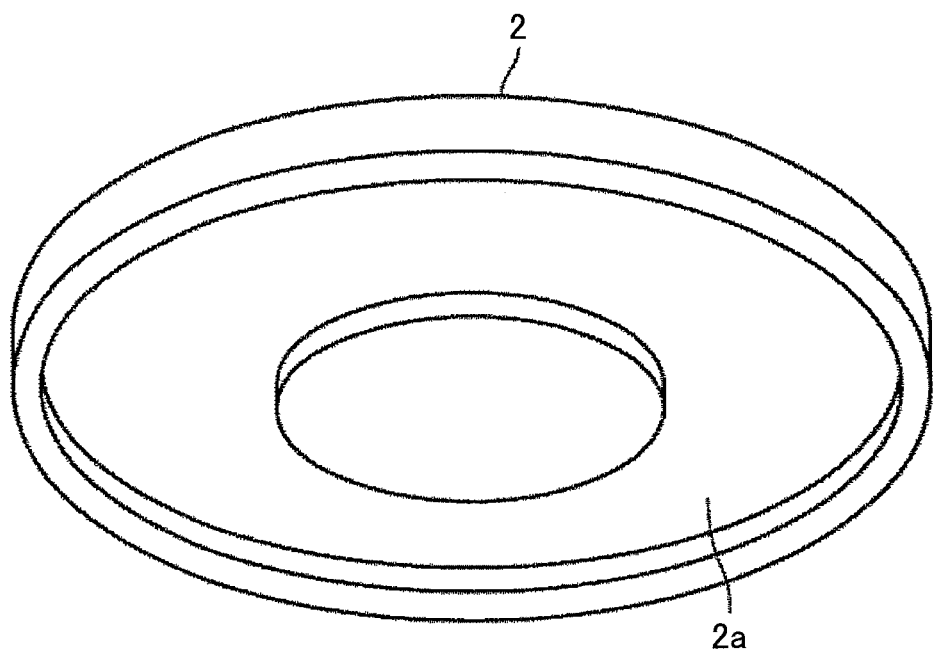
FIG. 5 is a perspective view that illustrates a rotating table in the film formation device.
Figure 9:
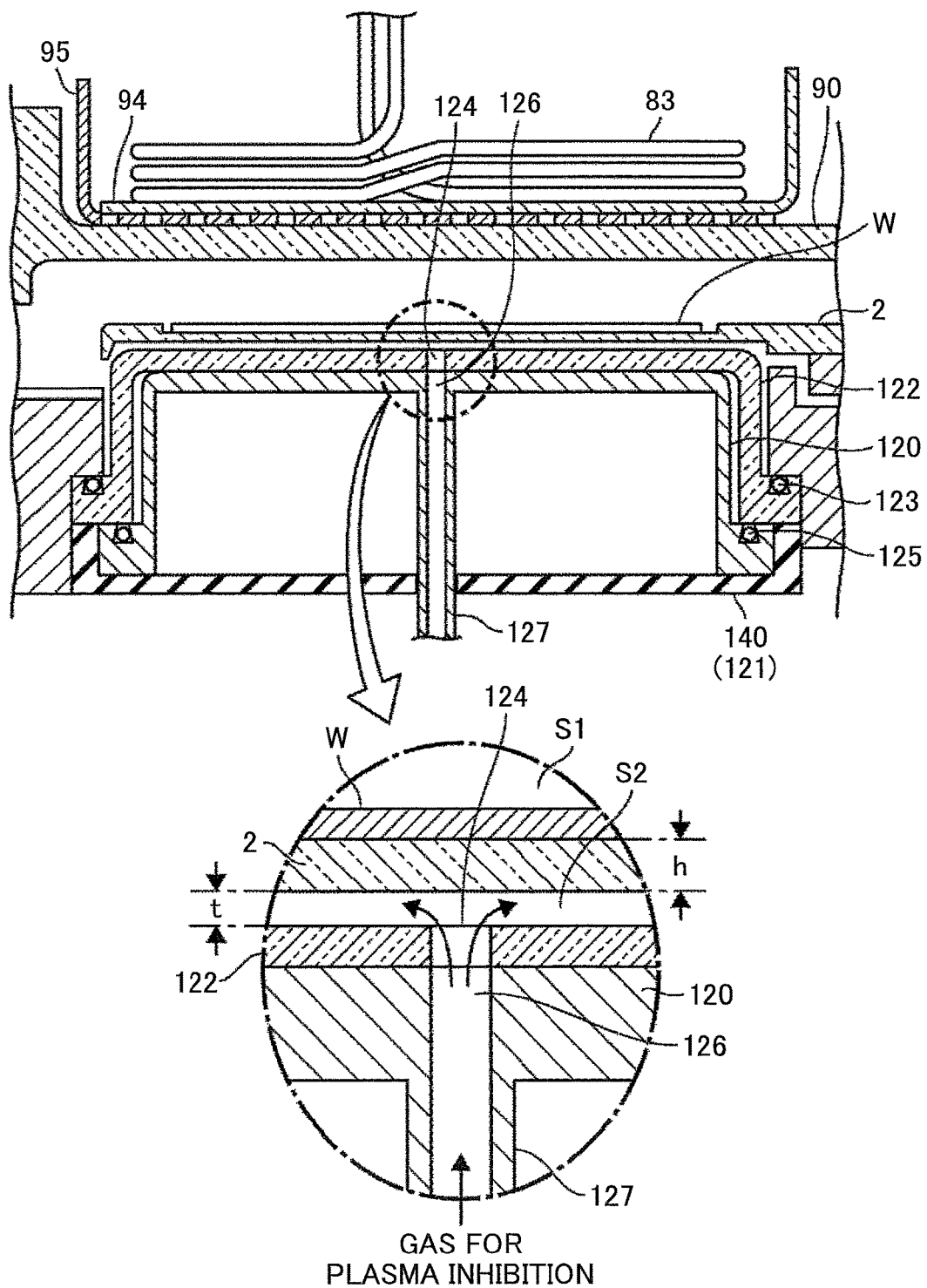
FIG. 9 is a longitudinal sectional view that enlarges and illustrates a plasma processing part and a lower bias electrode.

As illustrated in FIG. 3 to FIG. 4, a plurality of, for example 5, recesses 24 that are mounting areas for a wafer W are formed on a surface of the rotating table 2 along a direction of rotation of the rotating table 2 (peripheral direction). As illustrated in FIG. 5 and FIG. 9, a groove portion 2a that is a recess hollowed in a concentric-circular shape with respect to the rotating table 2 or a ring shape to store the lower bias electrode 120 is provided on a bottom surface of the rotating table 2 so that a size (a size of a plate thickness of the rotating table 2) h between a bottom surface of each recess 24 and the bottom surface of the rotating table 2 is as small as possible. The size of a plate thickness h is, for example, 6 mm to 20 mm. Here, FIG. 5 illustrates a perspective view of the rotating table 2 when viewed from a lower side thereof.

Five nozzles 31, 32, 34, 41, and 42 that are each composed of, for example, quartz are mutually spaced in a peripheral direction of the vacuum chamber 1 and arranged radially at positions facing respective passage areas of the recesses 24. Each of these nozzles 31, 32, 34, 41, and 42 is attached, for example, to face a wafer W and extend horizontally from an outer peripheral wall of the vacuum chamber 1 to a central portion thereof. In this example, a gas-for-plasma-generation nozzle 34, a separation gas nozzle 41, a first process gas nozzle 31, a separation gas nozzle 42, and a second process gas nozzle 32 are arranged in this order in a clockwise fashion (a direction of rotation of the rotating table 2) when viewed from a conveyance port 15 as described below.

Figure 2:
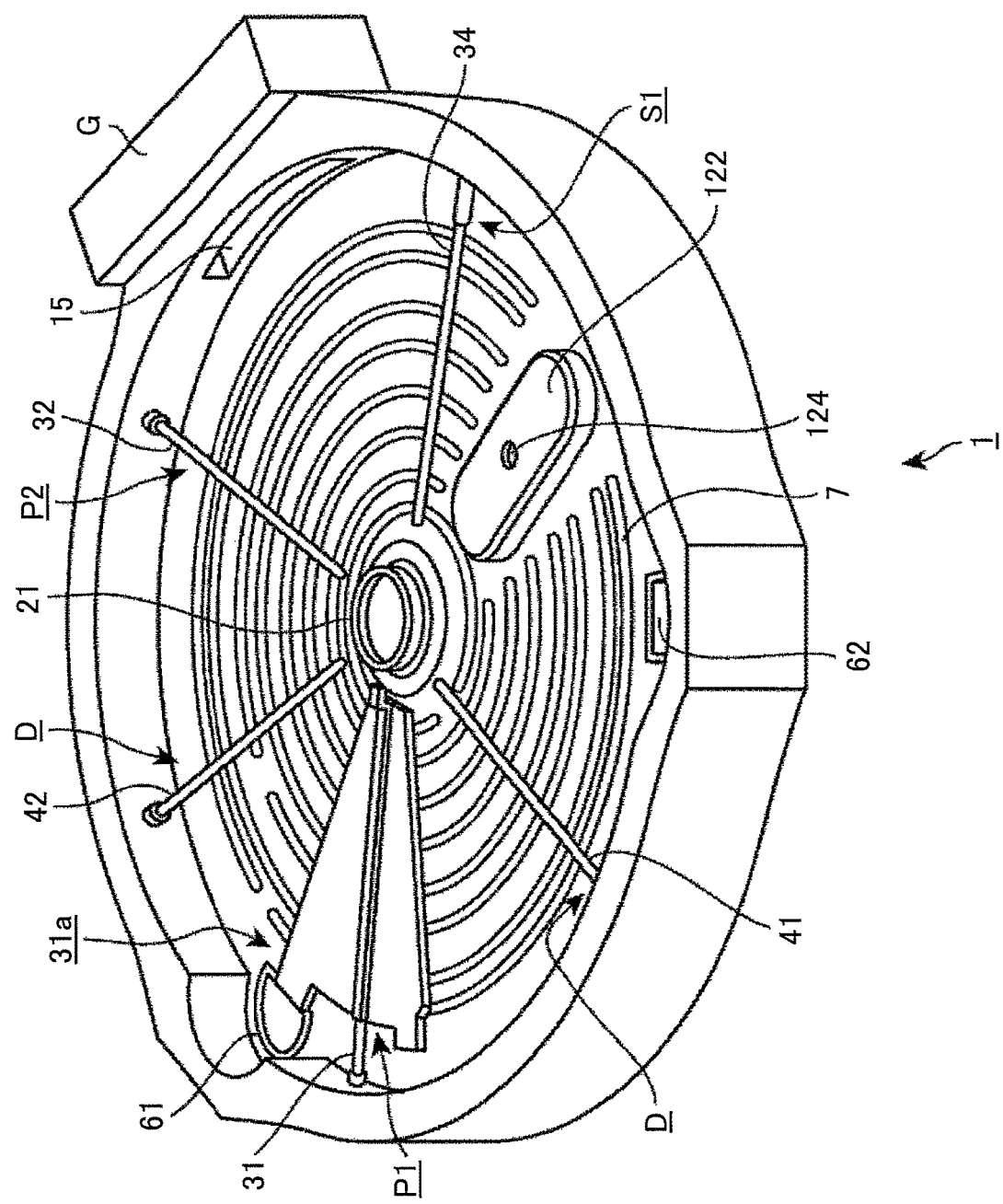
FIG. 2 is a perspective view that illustrates the film formation device.

The process gas nozzles 31 and 32 are a first process gas supply part and a second process gas supply part, respectively, while the gas-for-plasma-generation nozzle 34 is a gas-for-plasma-generation supply part. Furthermore, each of the separation gas nozzles 41 and 42 is a separation gas supply part. Here, FIG. 2 and FIG. 3 illustrate a condition that a plasma processing part 80 and a housing 90 as described below are removed to be capable of seeing the gas-for-plasma-generation nozzle 34 and FIG. 4 illustrates a condition that such a plasma processing part 80 and a housing 90 are attached. Furthermore, FIG. 2 illustrates a condition that the rotating table 2 is also removed.

The respective nozzles 31, 32, 34, 41, and 42 are connected to the following or respective gas supply sources (not illustrated) through respective flow regulating valves. That is, the first process gas nozzle 31 is connected to a supply source for a first process gas that includes Si (silicon), for example, BTBAS (bistertiarybutylaminosilane, $SiH_2(NH-C(CH_3)_3)_2$) gas or the like. The second gas nozzle 32 is connected to a supply source for a second process gas, for example, a mixed gas of ozone ($O_3$) gas and oxygen ($O_2$) gas (an oxygen gas supply part provided with an ozonizer in detail). The gas-for-plasma-generation nozzle 34 is connected to a supply source for a gas for plasma generation that is composed of, for example, a mixed gas of argon (Ar) gas and oxygen gas. Each of the separation gas nozzles 41 and 42 is connected to a gas supply source for a nitrogen gas that is a separation gas. Gas ejection ports 33 are formed at, for example, a side of respective bottom surfaces of these gas nozzles 31, 32, 34, 41, and 42, and these gas ejection ports 33 are arranged at a plurality of places, for example, at regular intervals along a radial direction of the rotating table 2. In FIG. 2 and FIG. 3, 31a indicates a nozzle cover (fin).

Areas under the process gas nozzles 31 and 32 are a first processing area (film formation area) P1 for causing a first process gas to be adsorbed to the wafer W and a second processing area P2 for causing reaction between a first process gas component adsorbed to a wafer W and a second process gas, respectively. An area at a lower side of the gas-for-plasma-generation nozzle 34 is a modification area (plasma generation area) S1 for conducting a plasma modification process for a wafer W, as described below. The separation gas nozzles 41 and 42 are to form separation areas D for separating the first processing area P1 and the second processing area 22, respectively. A lower ceiling surface that is a bottom surface of a convex portion 4 is arranged on a top plate 11 of the vacuum chamber 1 in the separation areas D to inhibit mutual mixing of process gasses.

Figure 6:
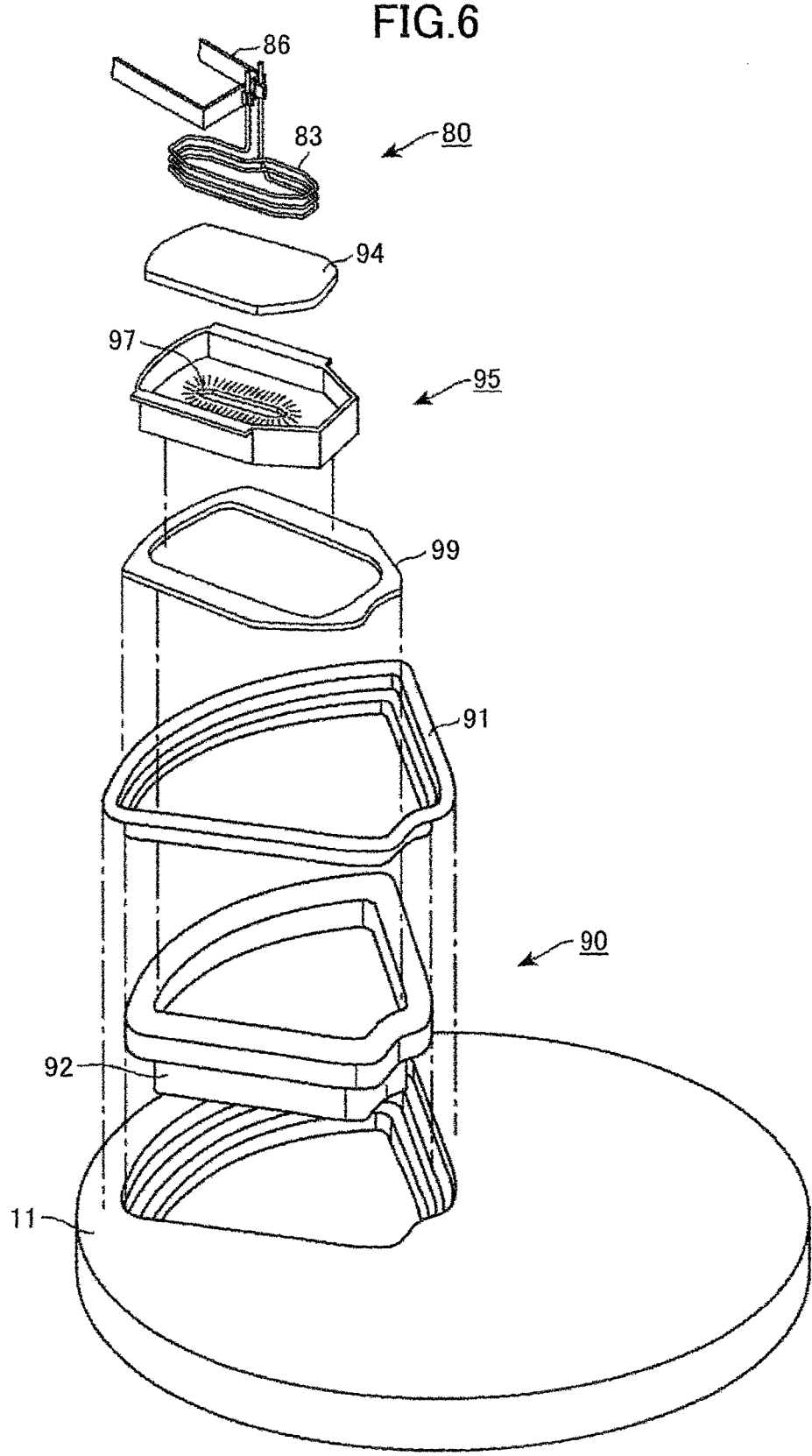
FIG. 6 is an exploded perspective view that illustrates a plasma processing part in the film formation device.

Next, the plasma processing part 80 as already described will be described. As illustrated in FIG. 1 and FIG. 6, this plasma processing part 80 is configured to wind an antenna 83 composed of a metal wire around a vertical axis in a coil shape and arranged to pass over a passage area of a wafer W from a side of a central portion to a side of an outer peripheral portion of the rotating table 2 when viewed in a plane. As illustrated in FIG. 4, this antenna 83 has a generally octagonal shape to surround a band-shaped area extending in a radial direction of the rotating table 2. An electrical circuit for this antenna 83 will be described below.

The antenna 83 is arranged to be compartmented airtightly from an internal area of the vacuum chamber 1. That is, the top plate 11 at a upper side of the gas-for-plasma-generation nozzle 34 as already described has a generally fan-shaped opening when viewed in a plane, and as illustrated in FIG. 6, is air-tightly sealed by the housing 90 that is composed of a dielectric of, for example, quartz or the like. This housing 90 is formed in such a manner that a peripheral portion extends horizontally in a peripheral direction and protrudes in a flange shape and a central portion is hollowed toward an internal area of the vacuum chamber 1, and the antenna 83 is stored inside this housing 90. In FIGS. 1, 11a indicates a seal member provided between the housing 90 and the top plate 11 and 91 indicates a pressurizing member for pressurizing a peripheral portion of the housing 90 toward a lower side. Furthermore, 86 in FIG. 1 indicates a connection electrode for electrically connecting the antenna 83 to a plasma high-frequency power source 85 as described below.

As illustrated in FIG. 1, a bottom surface of the housing 90 is such that an outer peripheral portion extends vertically and protrudes toward a lower side (a side of the rotating table 2) in a peripheral direction in order to inhibit penetration of a nitrogen gas, an ozone gas, or the like, to a lower area of the housing 90 and so as to provide a protrusion portion 92 for gas regulation. Then, the gas-for-plasma-generation nozzle 34 as already described is stored in an area surrounded by an inner peripheral surface of this protrusion portion 92, a bottom surface of the housing 90, and a top surface of the rotating table 2.

As illustrated in FIG. 1, FIG. 4, and FIG. 6, a generally box type Faraday shield 95 with an opening at a side of a top surface thereof is arranged as an upper bias electrode between the housing 90 and the antenna 83, and this Faraday shield 95 is composed of a metal plate that is an electrically conductive plate-shaped body. The Faraday shield 95 is arranged in such a manner that a horizontal plane of the Faraday shield 95 is horizontal with respect to a wafer W on the rotating table 2. An electrical circuit for this Faraday shield 95 will be described below.

Slits 97 are formed on a horizontal plane of the Faraday shield 95 in order to inhibit an electric field component among electric field and magnetic field (electromagnetic field) generated in the antenna 83 from being directed toward the wafer at a lower side and cause the magnetic field to reach a wafer W. This slit 97 is formed so as to extend in a direction orthogonal to (or intersecting with) a direction of winding of the antenna 83, and provided at a position lower than the antenna 83 in a peripheral direction along the antenna 83. An insulation plate 94 composed of, for example, quartz is interposed between the Faraday shield 95 and the antenna 83 so as to provide insulation between such a Faraday shield 95 and an antenna 83.

Figure 7:
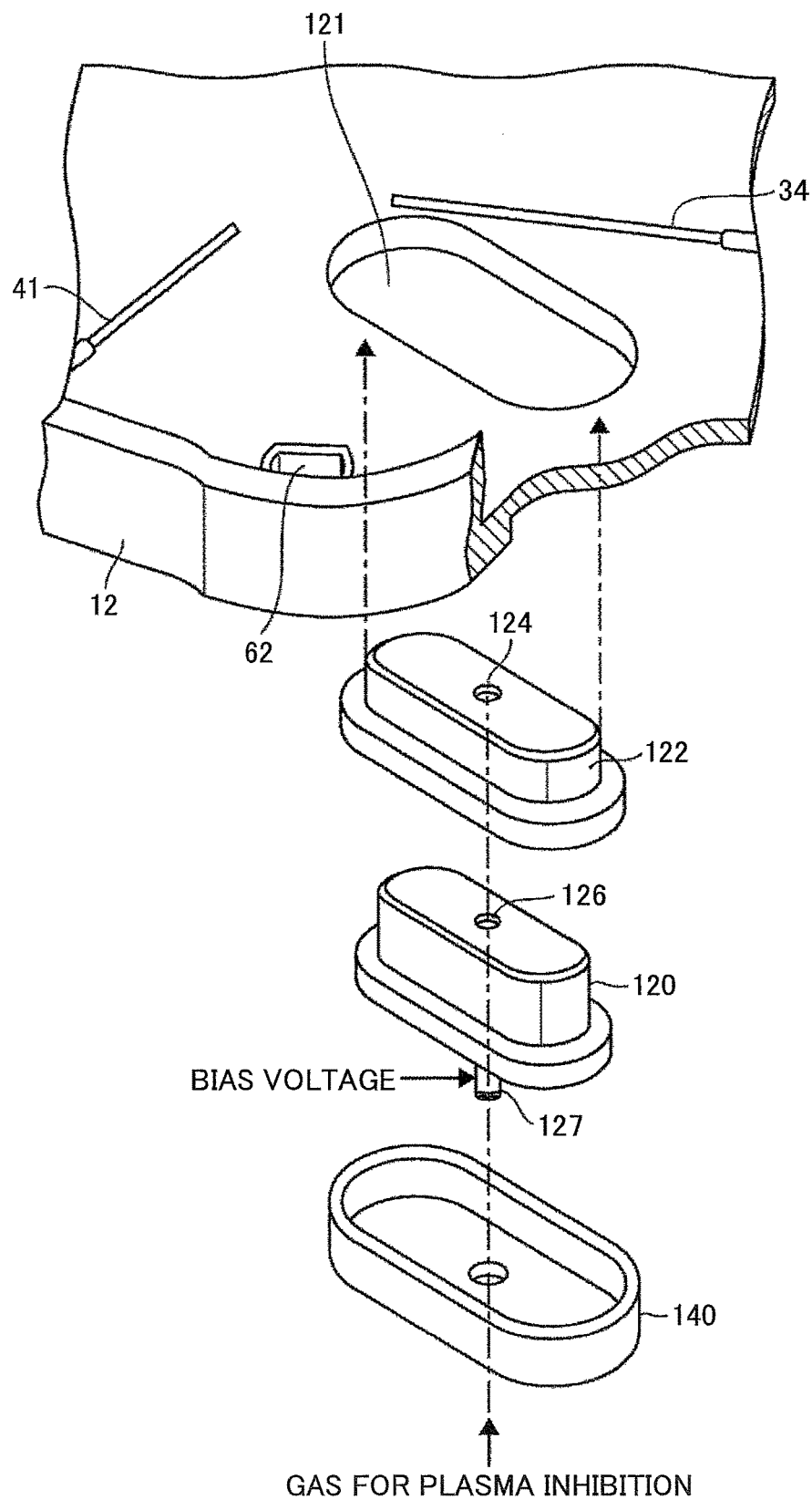
FIG. 7 is an exploded perspective view that illustrates a lower bias electrode in the film formation device.
Figure 8:
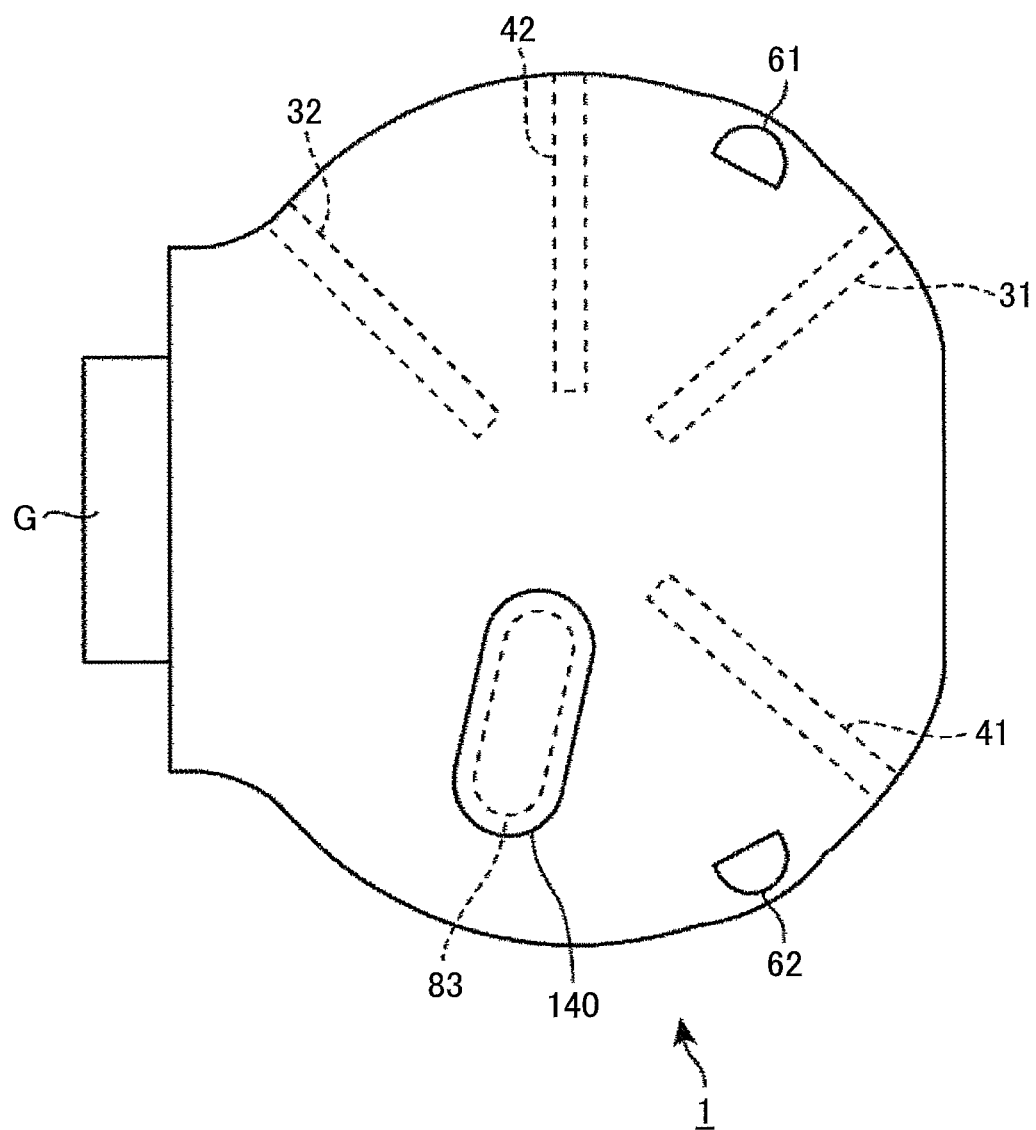
FIG. 8 is a plan view that illustrates a situation of the film formation device when viewed from a side of a back surface thereof.

Then, as illustrated in FIG. 1 and FIG. 7, an opening portion 121 is formed on a bottom surface portion of the vacuum chamber 1 at a lower side of the Faraday shield 95, and this opening portion 121 has an opening to have an elliptical shape that is identical to an area with an arranged antenna 83 or greater than the area when viewed from a plane. An insulation member 122 with an opening at a lower side thereof and a hollow and generally cylindrical shape is air-tightly inserted into this opening portion 121 from a lower side, and this insulation member 122 is formed to have an elliptical shape similar to the opening portion 121 when viewed in a plane. An outer peripheral edge of the insulation member 122 at a side of a bottom end extends toward an outer side and protrudes in a flange shape in a peripheral direction, and air-tightly contacts a bottom surface portion of the vacuum chamber 1 with a seal member 123 such as an O-ring provided in a peripheral direction at a side of a top surface with respect to this outer peripheral edge at the bottom end. As an area between this insulation member 122 and the rotating table 2 is referred to as a plasma non-excitation area S2, a gas ejection port 124 that penetrates the insulation member 122 in a vertical direction is formed at a generally central portion of an top surface portion of the insulation member 122 in order to eject a gas for plasma inhibition as described below to the plasma non-excitation area S2. In this example, the insulation member 122 is composed of a dielectric of, for example, quartz or the like.

Then, the lower bias electrode 120 will be described in detail. This lower bias electrode 120 is to capacitively couple the lower side bias electrode 120 and the Faraday shield 95 to attract an ion in plasma to a wafer W on the rotating table 2 and is positioned at a lower side of the rotating table 2 through a gap area. That is, the lower bias electrode 120 has an opening at a side of a bottom end and a generally cylindrical shape in such a manner that this peripheral edge at the bottom end extends toward an outer side and protrudes in a flange shape, and is stored in an inside of the insulation member 122 as already described. In this example, the lower bias electrode 120 is composed of an electrically conductive member of, for example, nickel (Ni), copper (Cu), or the like.

Then, a peripheral edge of this lower bias electrode 120 at a side of a bottom end is arranged to be positioned nearer an inside of the insulation member 122 than an outer edge thereof so as not to contact a bottom surface portion of the vacuum chamber 1, and air-tightly arranged with respect to the insulation member 122 by a seal member 125 such as an O-ring provided at a top surface portion of the peripheral edge at a side of the bottom end. Therefore, the lower bias electrode 120 is arranged so as not to contact (so as to non-contact) the rotating table 2 and also be electrically insulated from the vacuum chamber 1.

A penetration port 126 for penetrating a top surface of the lower bias electrode 120 vertically is formed at a generally central portion of the lower bias electrode 120 so as to correspond to a position of arrangement of the gas ejection port 124 of the insulation member 122. As illustrated in FIG. 1, a flow channel member 127 composed of an electrically conductive member is air-tightly provided at a lower side of this penetration port 126 to supply a gas for plasma inhibition (for example, nitrogen gas ($N_2$), helium (He) gas, or the like) to the plasma non-excitation area S2.

As illustrated in FIG. 1, a sealing member 140 is arranged at a lower side of the lower bias electrode 120 and this sealing member 140 is composed of an insulator of, for example, quartz or the like, and formed in a generally circular plate shape. A peripheral edge of the sealing member 140 stands in a peripheral direction toward the insulation member 122 at an upper side between a bottom surface portion of the vacuum chamber 1 and a peripheral edge of the lower bias electrode 120. Therefore, the insulation member 122, the lower bias electrode 120, and the sealing member 140 are inserted from a lower side into the opening portion 121 of the vacuum chamber 1 in this order, and this sealing member 140 is fixed on a bottom surface portion of the vacuum chamber 1 by, for example, a bolt that is not illustrated in the figures or the like so that the insulation member 122 air-tightly contacts the vacuum chamber 1. Furthermore, the lower bias electrode 120 contacts the insulation member 122 air-tightly. Moreover, the sealing member 140 electrically insulates between the lower bias electrode 120 and the vacuum chamber 1.

Then, as enlarged and illustrated at a lower side of FIG. 9, a top surface of the insulation member 122 is positioned in the groove portion 2a at a side of a bottom surface of the rotating table 2 and a wafer W on the rotating table 2 is parallel to the lower bias electrode 120 in a plane. A size of separation t between a bottom surface of the rotating table 2 and a top surface of the insulation member 122 is, for example, 0.5 mm to 3 mm. FIG. 9 illustrates a plan view of the vacuum chamber 1 when viewed from a lower side, wherein the sealing member 140 at a position corresponding to an area of winding of the antenna 83 is formed to be greater than the area. Here, depiction of the seal members 123 and 125 is omitted in FIG. 7.

A ring-shaped side ring 100 is arranged at a peripheral side of the rotating table 2 and a groove-shaped gas flow channel 101 for flowing a gas while avoiding the housing 90 is formed on a top surface of the side ring 100 at a side of a periphery of the housing 90 as already described. Exhaust ports 61 and 62 that correspond to the first processing area P1 and the second processing area P2, respectively, are formed on a top surface of this side ring 100. As illustrated in FIG. 1, such a first exhaust port 61 and a second exhaust port 62 are connected to, for example, a vacuum pump 64 that is an exhaust mechanism through an exhaust pipe 63 that is each provided with or interposes a pressure regulating part 65 such as a butterfly valve.

As illustrated in FIG. 2 to FIG. 4, a conveyance port 15 for conducting delivery of a wafer W between an external conveyance arm that is not in the figures and the rotating table 2 is formed on a side wall of the vacuum chamber 1 and this conveyance port 15 is configured to be air-tight and openable and closable due to a gate valve G. Furthermore, elevating pins (that are not illustrated in the figures) for lifting a wafer W at a side of a back face thereof through a penetration port of the rotating table 2 are provided at a lower side of the rotating table 2 at a position facing this conveyance port 15.

Figure 10:
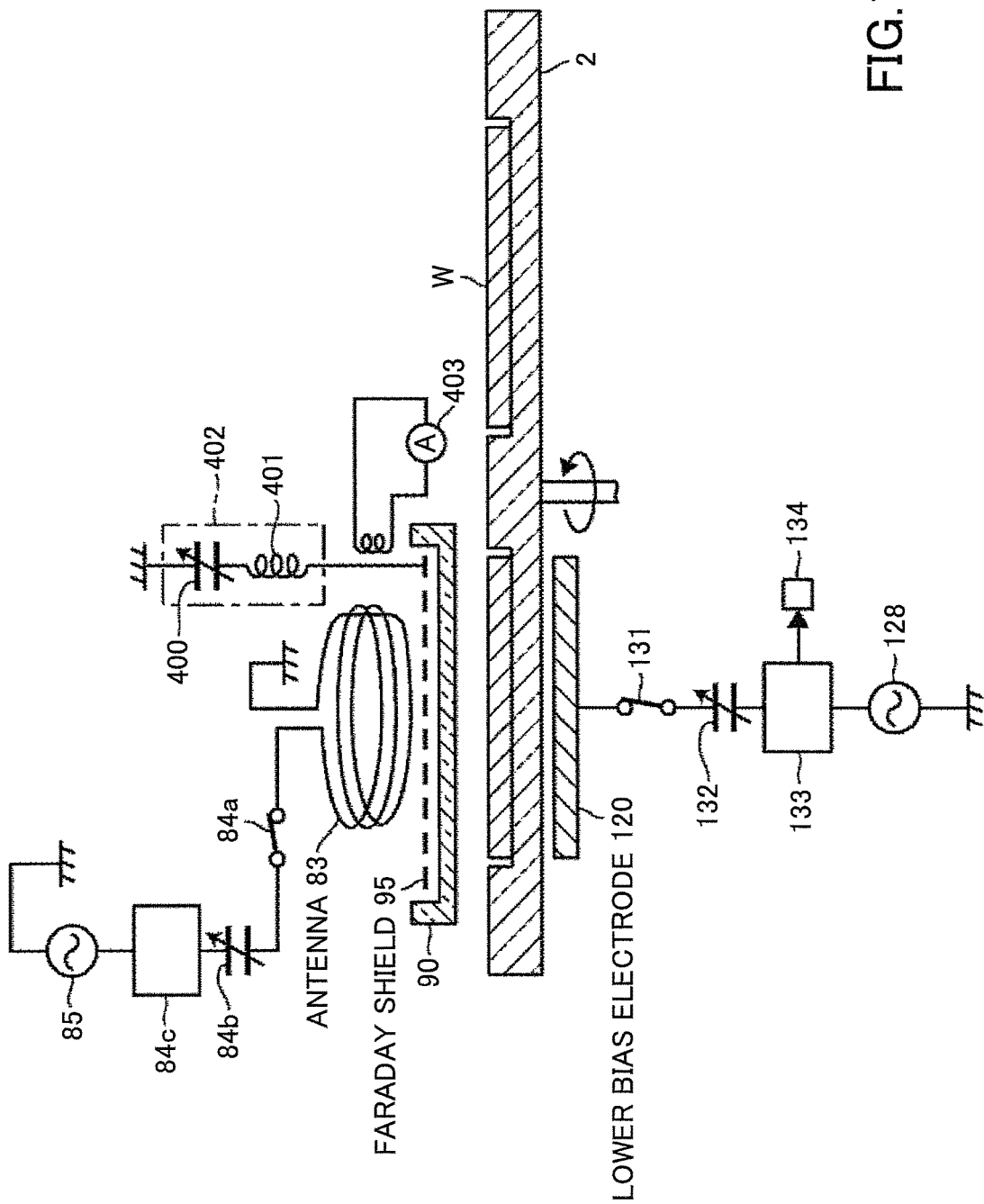
FIG. 10 is a longitudinal sectional view that schematically illustrates a bias space formed in the film formation device.

Next, an electrical circuit for each of the antenna 83, the Faraday shield 95, and the lower bias electrode 120 as described above will be described in detail. As illustrated in FIG. 10, a high-frequency power source 85 with a frequency of, for example, 13.56 MHz and an output power of, for example, 5000 W is connected to the antenna 83 through a switch 84a, a matching unit (matching box) 84b, and a filter 84c. Here, the filter 84c is to inhibit (cur) a signal in a frequency band of a high-frequency power source 128 as described below.

Furthermore, the Faraday shield 95 is grounded through a bias drawing circuit 402 that includes, for example, a variable capacitance capacitor 400, an inductance 401, or the like. A detection part 403 for detecting a value of electric current is provided at a side of a former part of this bias drawing circuit 402 (a side of the Faraday shield 95), and for example, a value of a capacitance of the variable capacitance capacitor 400 is adjusted by an actuator (that is not illustrated in the figures) based on a detection value of the detection part 403. Specifically, an impedance between the Faraday shield 95 and the lower bias electrode 120 is adjusted in such a manner that the value of electric current is greater than a set value near a preliminarily obtained maximum and flowing of a high frequency wave in an abnormal path is suppressed to prevent continuous discharge.

Alternatively, an impedance between the Faraday shield 95 and the lower bias electrode 120 may automatically be adjusted by a control part 200 as described below. In a case where the impedance is thus adjusted automatically, the detection part 403 may be configured to measure an impedance (mainly, a reactance component) between the Faraday shield 95 and the lower bias electrode 120 instead of detecting of a value of electric current or together with this value of electric current. Then, how a value of a capacitance of the variable capacitance capacitor 400 is adjusted preliminarily, specifically, whether the value of a capacitance is adjusted to increase or the value of a capacitance is adjusted to decrease when the impedance increases, may be determined preliminarily based on an change in the impedance. That is, while a control parameter (a value of electric current or an impedance) is monitored, the control part 200 may adjust the impedance automatically, or the impedance may be fixed preliminarily. Therefore, in a case where the impedance is automatically adjusted through the control part 200, abnormal discharge is prevented during plasma processing.

Then, a high-frequency power source 128 with a frequency of 50 kHz to 40 MHz and an output power of 500 to 5000 W is electrically connected to the lower bias electrode 120 (a flow channel member 127 in detail) through a switch 131, a matching unit 132, and a filter 133. In this example, a frequency of this high-frequency power source 128 and a frequency of the plasma high-frequency power source 85 for plasma generation as already described are mutually different frequencies (the frequency of the high-frequency power source 128: 13.56 to 100 MHz). Respective earth sides of this high-frequency power source 128 and the bias drawing circuit 402 as already described are mutually connected by an electrically conductive path that is not illustrated in the figures.

The filter 133 is to cut a signal in a frequency band of the plasma high-frequency power source for plasma generation 85, and for example, is connected to an electric current detection part 34 for detecting a value of electric current flowing through, for example, the filter 133. Here, the electric current detection part 134 may be configured to detect a voltage on the filter 133 instead of the value of electric current or together with the value of electric current.

Therefore, as schematically illustrated in FIG. 10, the configuration composed of the lower bias electrode 120 and the Faraday shield 95 as described above is a pair of opposite electrodes, and when a wafer W is positioned at a lower side of a modification area S1, each of them is arranged at a position for overlapping with the wafer W when viewed in a plane. Then, capacitance coupling between these opposite electrodes is formed by a high-frequency power supplied from the high-frequency power source 128 to the lower bias electrode 120, to generate so-called bias space S3. Accordingly, an ion in plasma formed in the vacuum chamber 1 by the plasma processing part 80 oscillates (moves) in vertical directions in this bias space S3 as described below. Therefore, as a wafer W is positioned in this bias space S3 by rotation of the rotating table 2, an ion moves in vertical directions and accordingly impinges on a wafer W and the ion is attracted to a wafer W. Here, the electrical circuit as described above is omitted in FIG. 1.

Furthermore, as illustrated in FIG. 1, this film formation device is provided with the control part 200 that is composed of a computer for conducting a control of an operation of an entire device, and a program for conducting a film formation process and a plasma modification process as described below is stored in a memory of this control part 200. Then, for conducting a plasma modification process, the control part 200 has a feedback function for adjusting a density of plasma generated in the vacuum chamber 1. Specifically, the control part 200 is configured to adjust a reactance of the filter 133 or a value of a capacitance of the matching unit 84b based on a value of electric current flowing through the filter 133 connected to the lower bias electrode 120. This program is programmed to have a group of steps for conducting an operation of the device as described below and is installed from a memory part 201 that is a memory medium such as a hard disk, a compact disk, a magneto-optical disk, a memory card, or a flexible disk, into the control part 200.

Figure 11:
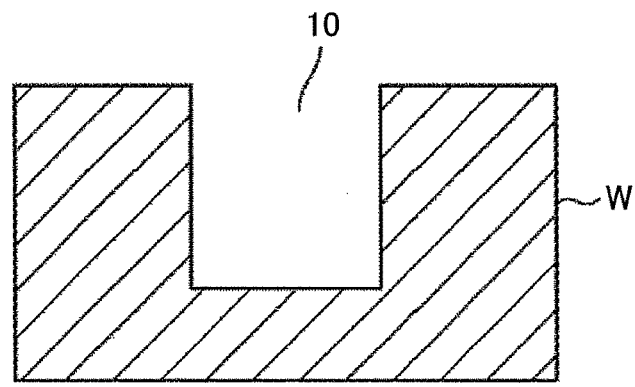
FIG. 11 is a longitudinal sectional view that schematically illustrates a target substrate to be subjected to a film formation process in the film formation device.

Next, an action of the above-mentioned embodiment will be described. First, while a gate valve G is opened and the rotating table 2 is rotated intermittently, for example, 5 wafers W is mounted on the rotating table through the conveyance port 15 by a conveyance arm that is not illustrated in the figures. As illustrated in FIG. 11, a recess 10 composed of a groove, a hole, or the like is formed on a surface of each wafer W and an aspect ratio of this recess 10 (a size of a depth of the recess 10/a size of a width of the recess 10) is greater than, for example, tens to hundreds. Then, while the gate valve G is closed and an inside of the vacuum chamber 1 is vacuumed out by the vacuum pump 64, the rotating table 2 is rotated clockwise at, for example, 2 rpm to 240 rpm. Then, a wafer W is heated at, for example, about 300° C. by the heater unit 7.

Subsequently, a first process gas and a second process gas are ejected from the process gas nozzles 31 and 32, respectively, and a gas for plasma generation is ejected from the gas-for-plasma-generation nozzle 34. Furthermore, a gas for plasma inhibition is ejected to the plasma non-excitation area S2 in such a manner that a pressure in the area S2 is a pressure grater (higher) than that in a modification area S1, that is, generation of plasma is inhibited in the area S2. This gas for plasma inhibition passes through a lower side of the rotating table 2 and is exhausted from the exhaust port 62.

Furthermore, a separation gas is ejected from the separation gas nozzles 41 and 42 at predetermined flow rates and nitrogen gas is ejected from the separation gas supply tube 51 and the purge gas supply tubes 71 and 72 at predetermined flow rates. Then, an inside of the vacuum chamber 1 is controlled to be at a preset process pressure by the pressure adjustment part 65. Furthermore, a high-frequency power is supplied to each of the antenna 83 and the lower bias electrode 120.

Figure 12:
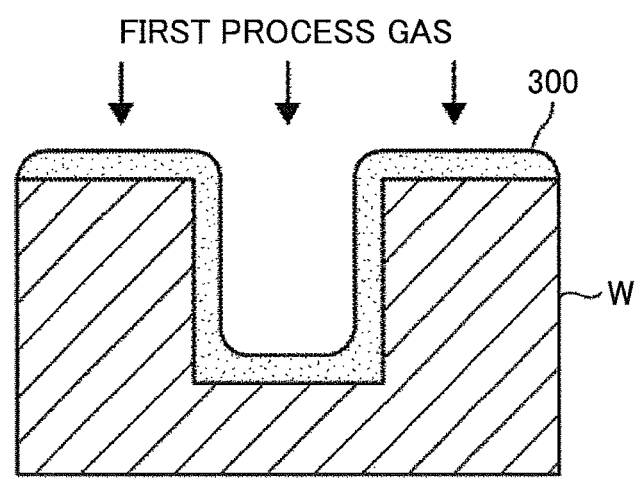
FIG. 12 is a longitudinal sectional view that schematically illustrates a situation of film formation on a substrate.
Figure 13:
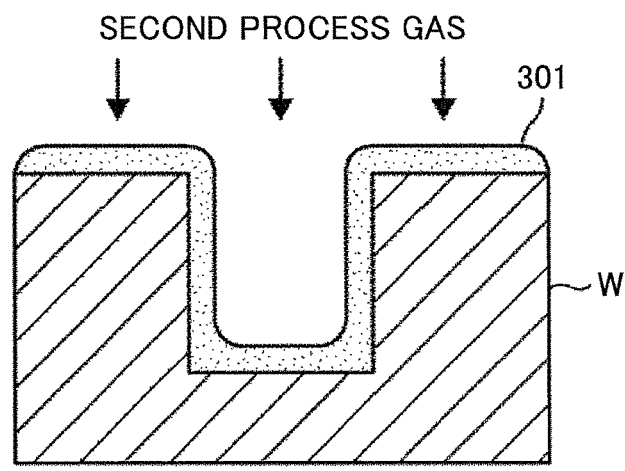
FIG. 13 is a longitudinal sectional view that schematically illustrates a situation of film formation on a substrate.

As illustrated in FIG. 12, a component of a first process gas is adsorbed on a surface of a wafer W in the first processing area P1 to produce an adsorption layer 300. Then, as illustrated in FIG. 13, the adsorption layer 300 on a wafer W is oxidized in the second processing area P2 so that one or more molecular layers of a silicon oxide film (SiO$_2$) that is a thin film component are formed to form a reaction layer 301 that is a reaction product. Due to, for example, a residue contained in a first process gas, an impurity such as a water component (OH group) or an organic material may remain in this reaction layer 301.

In the plasma processing part 80, electric field and magnetic field are generated by a high-frequency power supplied from the plasma high-frequency power source 85. Electric field among such electric field and magnetic field is reflected or absorbed (attenuated) by the Faraday shield 95 and reaching thereof to an inside of the vacuum chamber 1 is inhibited. On the other hand, magnetic field passes through this slit 97 because the slit 97 is formed on the Faraday shield 95, and reaches the modification area S1 in the vacuum chamber 1 through a bottom surface of the housing 90.

Therefore, a gas for plasma generation ejected from the gas-for-plasma-generation nozzle 34 is activated by a magnetic field to produce plasma of, for example, an ion (argon ion: Ar$^+$), a radical, or the like. Because the antenna 83 is arranged to surround a band-shaped area extending in a radial direction of the rotating table 2 as already described, this plasma has a general line shape to extend in a radial direction of the rotating table 2 at a lower side of the antenna 83.

Figure 14:
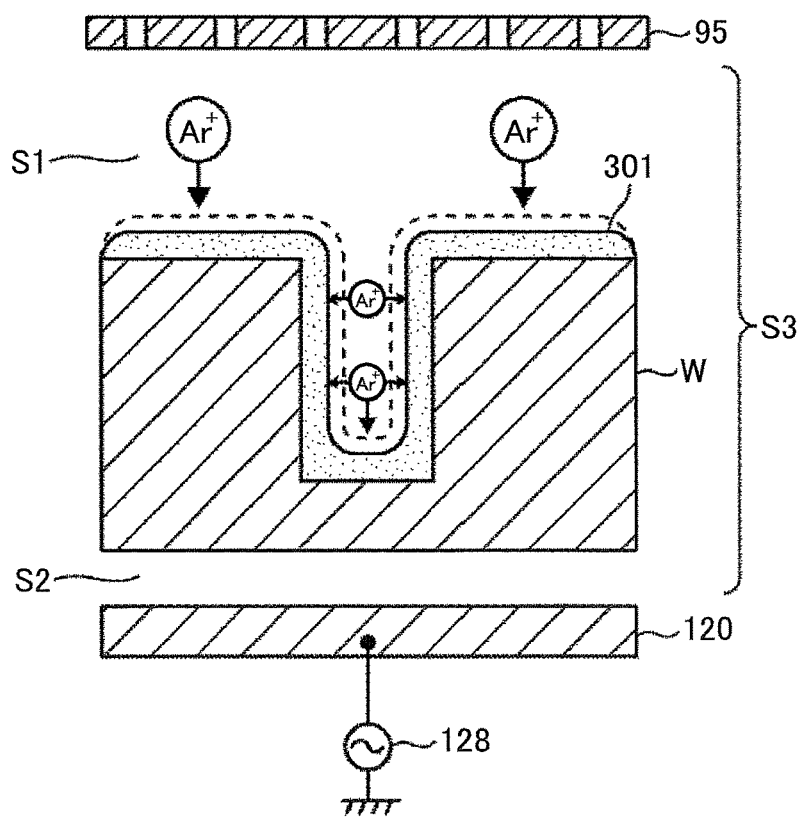
FIG. 14 is a longitudinal sectional view that schematically illustrates a situation of a plasma modification process on a substrate.

Herein, plasma tends to distribute in a so-called planar fashion along a direction of winding of the antenna 83. Because capacitance coupling is however provided between the Faraday shield 95 and the lower bias electrode 120 to form a high-frequency electric field, an electric field in vertical directions is applied to an ion in this plasma, and hence, the ion is attracted to a side of a wafer W as already described. Therefore, as illustrated in FIG. 14, an ion in plasma does not only contact a surface of a wafer W (a horizontal plane between mutually adjacent recesses 10) but also a surface of an inner wall of the recess 10 or a bottom surface of the recess 10. As an argon ion thus impinges on the reaction layer 301, an impurity such as a water component or an organic material is released from the reaction layer 301, or rearrangement of an element in the reaction layer 301 is caused to conduct densification (provide a higher density) of the reaction layer 301 and thereby modify the reaction layer 301. Accordingly, a modification process is homogeneously conducted in a surface of a wafer W and in a direction of a depth of the recess 10.

Subsequently, adsorption of the adsorption layer 300, production of the reaction layer 301, and a modification process on the reaction layer 301 are conducted in this order many times by continuing rotation of the rotating table 2, and a thin film is formed by lamination of the reaction layer 301. This thin film has a quality of dense and homogeneous film in a plane and in a direction of a depth of the recess 10. Here, FIG. 14 schematically illustrates the Faraday shield 95, the lower bias electrode 120, and a wafer W.

Because nitrogen gas is supplied between the first processing area P1 and the second processing area P2 while the above-mentioned sequential process is conducted, each gas is exhausted so that a first process gas or a second process gas and a gas for plasma generation is not mixed mutually. Furthermore, because a purge gas is supplied to a lower side of the rotating table 2, a gas that tends to diffuse to a lower side of the rotating table 2 is pushed back to sides of the exhaust ports 61 and 62 by the purge gas.

According to the above-mentioned embodiment, for conducting plasma processing for a wafer W, the Faraday shield 95 and the lower bias electrode 120 are arranged to be opposed through the wafer W so that the bias space S3 is formed through an area for positioning the wafer on the rotating table 2 at a lower side of the plasma processing part 80. Then, a high-frequency power is supplied to the lower bias electrode 120 so that such a lower bias electrode 120 and the Faraday shield 95 are capacitively coupled to form high-frequency electric field. Because plasma (an argon ion) is attracted to a side of a wafer W accordingly, it is possible to conduct a plasma modification process homogenously in a direction of a depth of the recess 10 even if the recess 10 with an larger aspect ratio is formed on a surface of the wafer W, and therefore, it is possible to form a thin film with an excellent uniformity of a film quality. Furthermore, because the bias space S3 is formed directly below the plasma processing part 80 to overlap a so-called modification area S1 and the bias space S3 mutually, it is possible to suppress generation of undesired plasma in an area other than the modification area S1. That is, plasma is intended to be generated at a lower position of the antenna 83 as already described but plasma may be generated (diffused) unexpectedly at, for example, a location with a locally lower pressure in the vacuum chamber 1, a location with an exposed metal surface such as an inner wall surface of the vacuum chamber 1, or the like. Then, as such an unexpected plasma interferes with, for example, an Si-containing gas, gas decomposition may be caused before being adsorbed on a wafer W to lead to degradation of film quality. However, as already described in detail, the bias space S3 is formed at a lower side of the antenna 83 to attract plasma (an ion) to a side of a wafer W. Accordingly, it is possible to suppress generation of unexpected plasma while a plasma modification process is conducted.

Moreover, because capacitance coupling between the Faraday shield 95 and the lower bias electrode 120 is formed to attract an ion to a side of a wafer W, impinging energy of such an ion is converted into heat to raise a temperature of the wafer W when the ion impinges on the wafer W. A temperature change (temperature rise) of this wafer W is proportional to electrical energy supplied to the high-frequency power source 128. Therefore, for conducting a modification process for a reaction product on a wafer W, not only an ion is supplied to the wafer W but also it is possible to raise a temperature of the wafer W, and hence, it is possible to form a thin film with even better film quality by a temperature rise of the wafer W.

A high-frequency wave for bias is not limited to one cycle but may be two cycles (wherein two high-frequency power sources with mutually difference frequencies are used) or may be three or more cycles. That is, because it is possible to adjust a degree of plasma processing between a central portion and an peripheral portion of a wafer W by connecting high-frequency power sources with mutually different frequencies to the lower bias electrode 120, it is possible to form a thin film with a uniform film quality in a plane of the wafer W.

Figure 15:
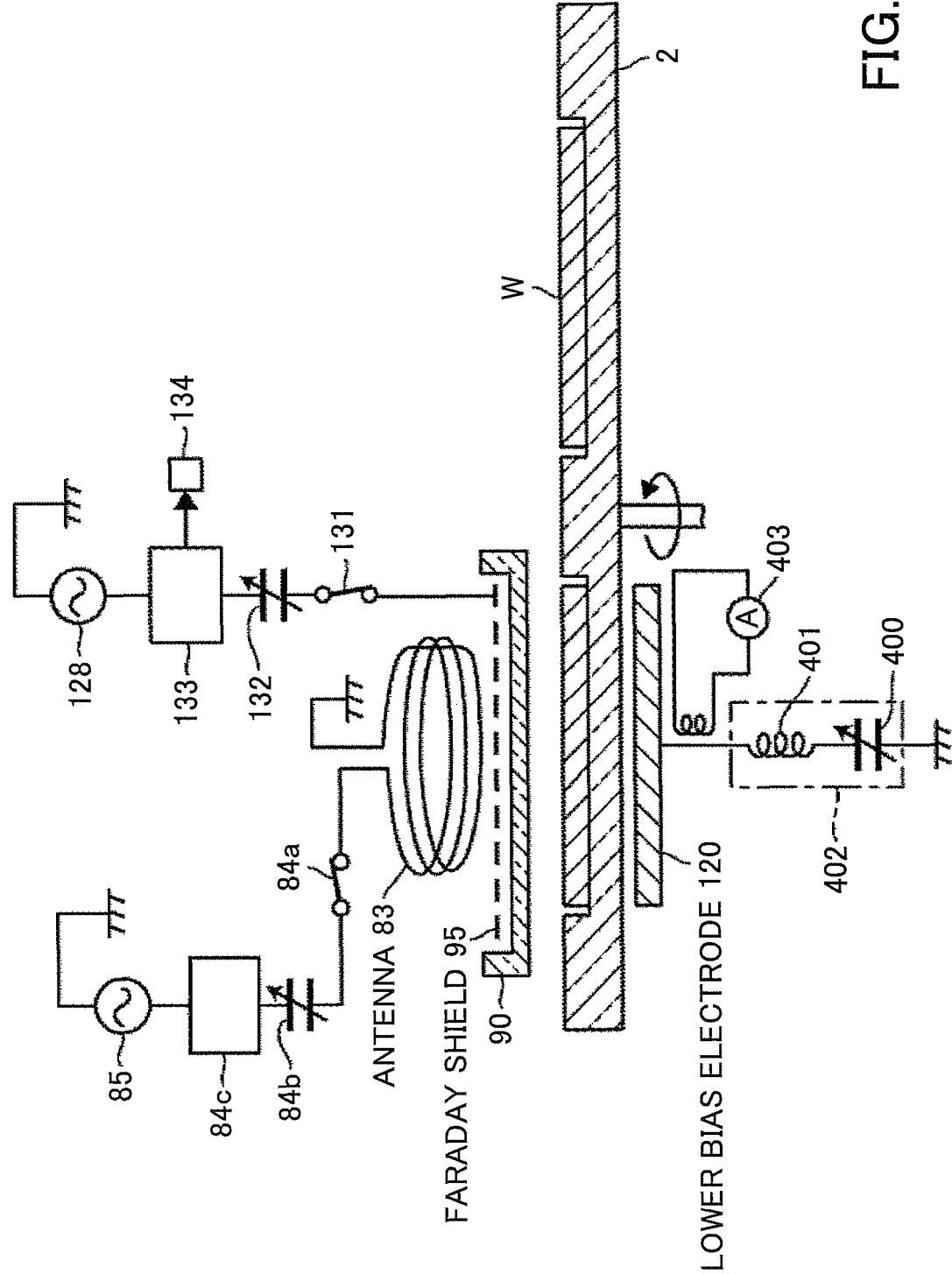
FIG. 15 is a longitudinal sectional view that schematically illustrates another example of the film formation device.
Figure 16:
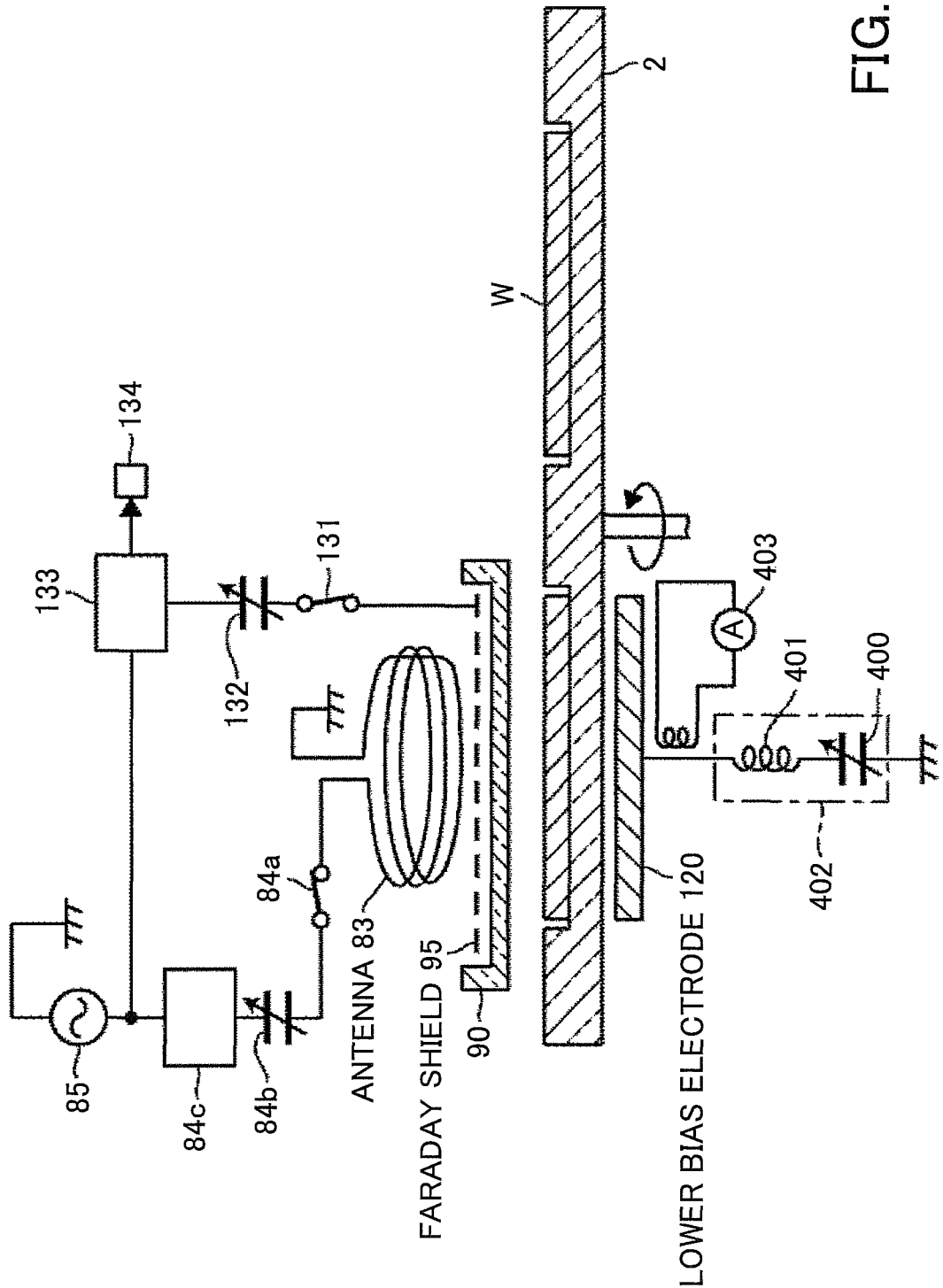
FIG. 16 is a longitudinal sectional view that schematically illustrates another example of the film formation device.

FIG. 15 illustrates an example of connecting the high-frequency power source 128 to the Faraday shield 95 corresponding to an upper bias electrode, instead of being connected to the lower bias electrode 120, as a configuration for capacitively coupling the Faraday shield 95 and the lower bias electrode 120. The lower bias electrode 120 is grounded through the bias drawing circuit 402. Furthermore, FIG. 16 illustrates an example of utilizing the plasma high-frequency power source for plasma generation 85, instead of the high-frequency power source 128, as a high-frequency power source for forming a capacitance coupling. That is, in FIG. 16, the plasma high-frequency power source 85 is connected to the antenna 83 and the Faraday shield 95 in parallel. It is possible to provide a device with an inexpensive configuration by making the plasma high-frequency power source for plasma generation 85 and the high-frequency power source 128 for bias electric field formation be common. Here, in FIG. 15 and FIG. 16, a reference numeral or character identical to that of the example as already described will be attached to the member as having already described and a description(s) thereof will be omitted, so that a configuration of a device is simplified and drawn. A similar matters also apply to other examples described below.

Even in a case where the high-frequency power source 128 (85) is thus connected to the Faraday shield 95, a two cycle or three or more cycle power source may be used as already described, or a two or more cycle power source may be connected to each of the faraday shield 95 and the lower bias electrode 120.

Figure 17:
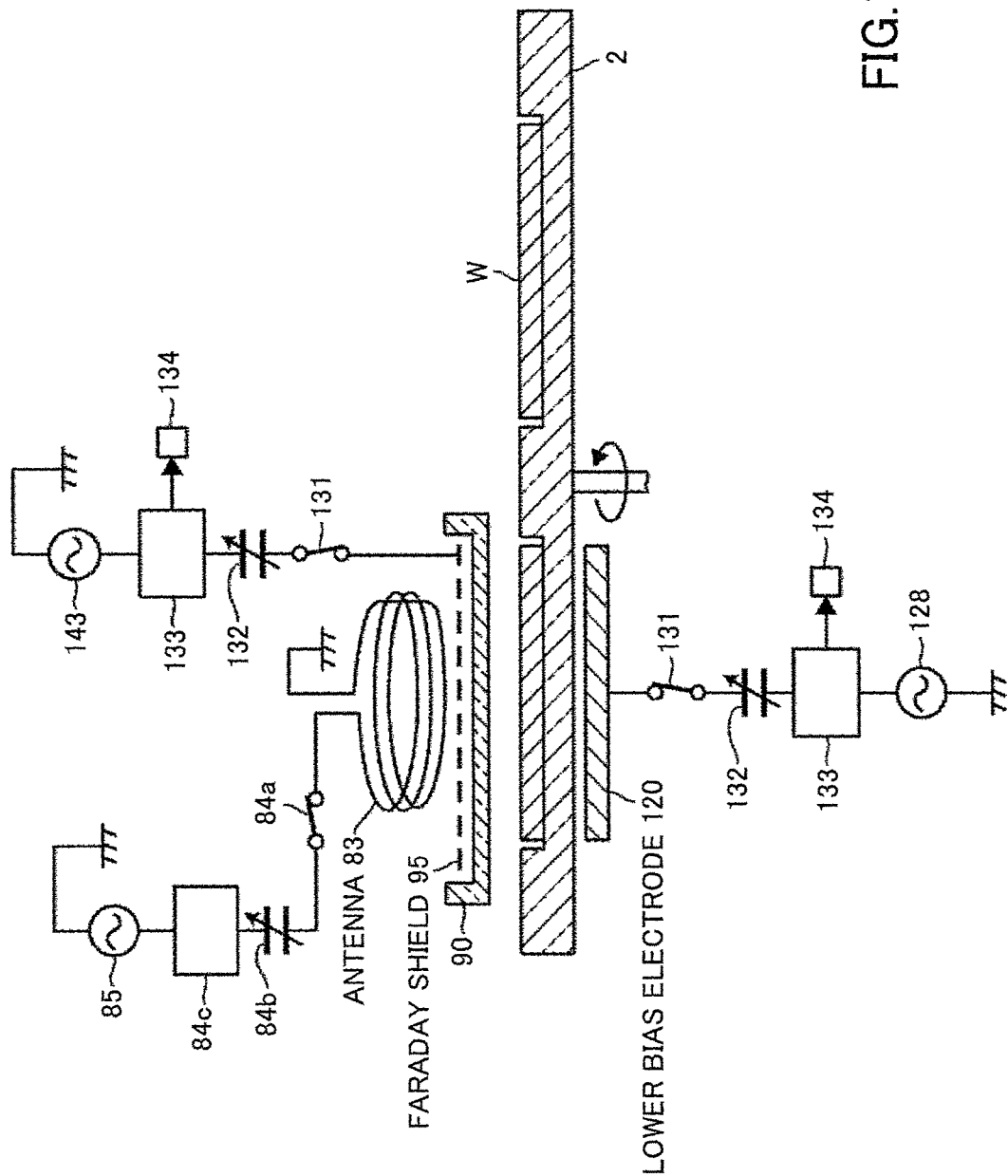
FIG. 17 is a longitudinal sectional view that schematically illustrates another example of the film formation device.

FIG. 17 illustrates an example of connecting the high-frequency power source 128 to the lower bias electrode 120 and also connecting another high-frequency power source 143 to the Faraday shield 95. In this example, an oscillation frequency of the high-frequency power source 143 is a frequency identical to that of the high-frequency power source 128. In this case, because it is possible to adjust a phase of each of the high-frequency power sources 128 and 143, it is possible to increase an intensity of bias electric field to be approximately twice as that in the configuration of FIG. 1 as already described, by conducting, for example, adjustment in such a manner that phases of the high-frequency power sources 128 and 143 are mutually opposite. Accordingly, it is possible to conduct further uniform plasma processing in a direction of a depth of the recess 10. Here, high-frequency powers supplied to the high-frequency power sources 128 and 143 may also be adjusted individually.

For supplying a high-frequency power to the Faraday shield 95 in FIG. 17, the plasma high-frequency power source for plasma generation 85 may be utilized like FIG. 16, instead of the high-frequency power source 143. In a case where the plasma high-frequency power source for plasma generation 85 is thus connected to the Faraday shield 95, a frequency of the high-frequency power source 128 to be supplied to the lower bias electrode 120 may also be identical to that of the plasma high-frequency power source 85.

Herein, like FIG. 17, it is preferable to make the high-frequency power sources 128 and 143 be common in a case where a high-frequency power with an identical frequency is supplied to the Faraday shield 95 and the lower bias electrode 120. That is, it is preferable to connect the high-frequency power source 128 to the Faraday shield 95 and the lower bias electrode 120, for example, in parallel. Then, in a case where phases of high frequency waves supplied to the Faraday shield 95 and the lower bias electrode 120 are opposite phases while a common high-frequency power source 128 is thus used, a configuration may be provided, for example, like FIG. 18. That is, in FIG. 18, high frequency waves to be supplied from the common high-frequency power source 128 to the Faraday shield 95 and the lower bias electrode 120 have mutually opposite phases by using two-transformer coupling.

Specifically, three winding wires (coils) 151 to 153 are formed that wind around respective axes extending from one side (left side) to the other side (right side), and these winding wires 151 to 153 are arranged from the one side to the other side in order in such a manner that the respective axes of the winding wires 151 to 153 are aligned on one line. Then, the winding wire 151 at the left side among these three winding wires 151 to 153 is such that a terminal at a left side is earthed and a terminal at a right side is connected to the Faraday shield 95. Furthermore, the central winding wire 152 among the three winding wires 151 to 153 is such that a terminal at a left side and a terminal at a right side are connected to the high-frequency power source 128 and the earth, respectively. Moreover, the winding wire 153 at the right side is such that a terminal at a left side is connected to the lower bias electrode 120 and a terminal at a right side is connected to the earth. Thus, it is possible to supply a high-frequency power from the common high-frequency power source 128 to the Faraday shield 95 and the lower bias electrode 120 at opposite phases.

Figure 18:
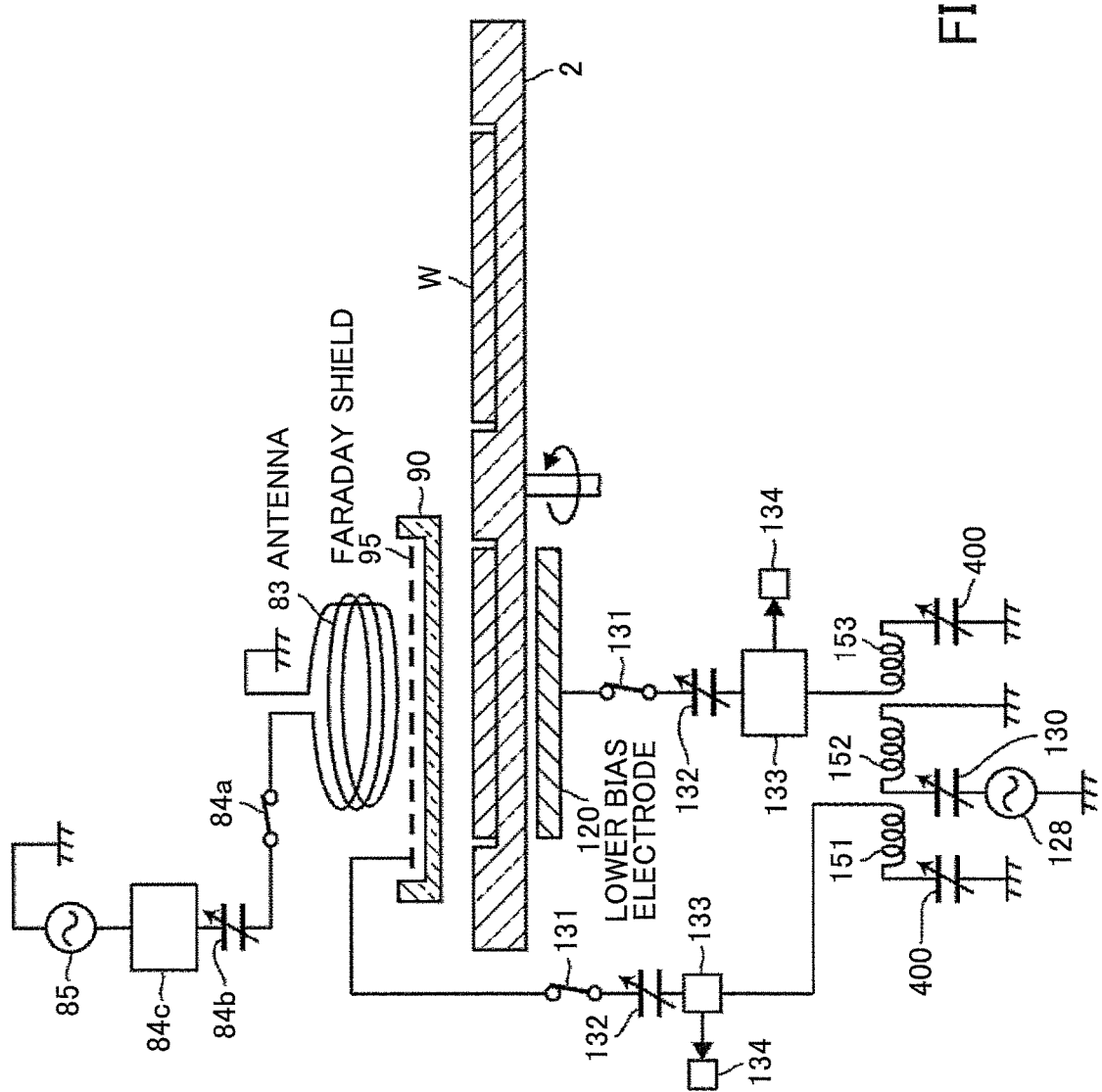
FIG. 18 is a longitudinal sectional view that schematically illustrates another example of the film formation device.
Figure 19:
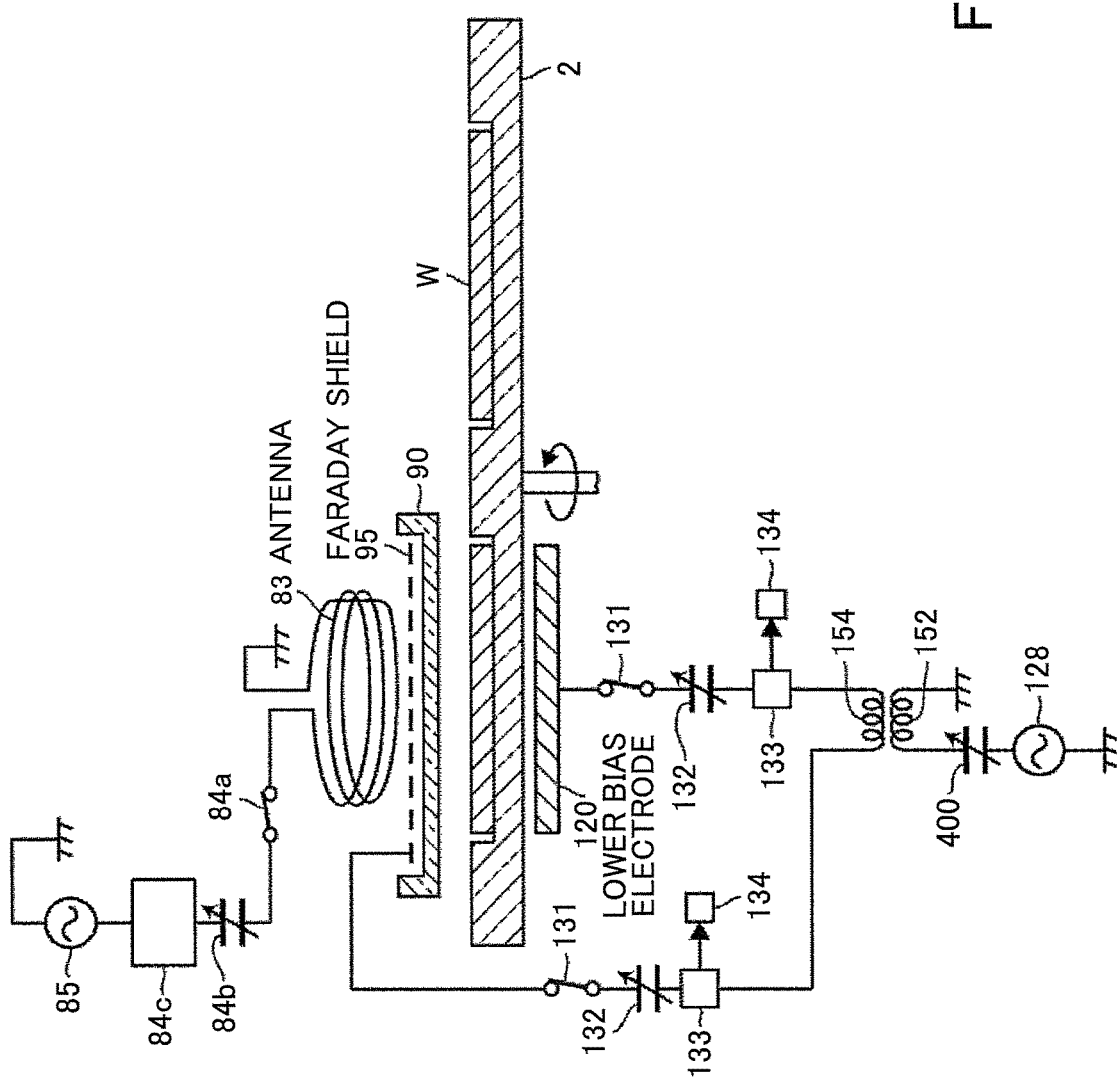
FIG. 19 is a longitudinal sectional view that schematically illustrates another example of the film formation device.

Furthermore, FIG. 19 illustrates an example of thus using the common high-frequency power source 128 and utilizing one transformer coupling for supplying a high-frequency power to the Faraday shield 95 and the lower bias electrode 120 at opposite phases. Specifically, a winding wire 154 that is configured similarly to FIG. 18 as already described is arranged between the Faraday shield 95 and the lower bias electrode 120 and the winding wire 152 connected to the high-frequency power source 1280 is arranged to be adjacent to the winding wire 154. Therefore, a winding axis of the winding wire 154 and a winding axis of the winding wire 152 in this example are mutually adjacent and mutually parallel. Then, a high-frequency power is supplied to such a Faraday shield 95 and lower bias electrode 120 at mutually opposite phases.

In a case where an electric power is supplied from the common high-frequency power source 128 to the Faraday shield 95 and the lower boas electrode 120 like FIG. 18 and FIG. 10 as described above, an electrical energy supplied to each of such a Faraday shield 95 and lower bias electrode 120 may be adjusted. Specifically, each of a coil for inductive coupling and a variable capacitor for impedance adjustment may be arranged between the high-frequency power source 128 and the Faraday shield 95 and between the high-frequency power source 128 and the lower bias electrode 120. Furthermore, in a case where the common high-frequency power source 128 is provided for the Faraday shield 95 and the lower bias electrode 120 as described above, the high-frequency power source 128 and the high-frequency power source for plasma generation 85 may be made be common. That is, the common high-frequency power source 85 may be connected to each of the antenna 83, the Faraday shield 95, and the lower bias electrode 120 in parallel.

Figure 20:
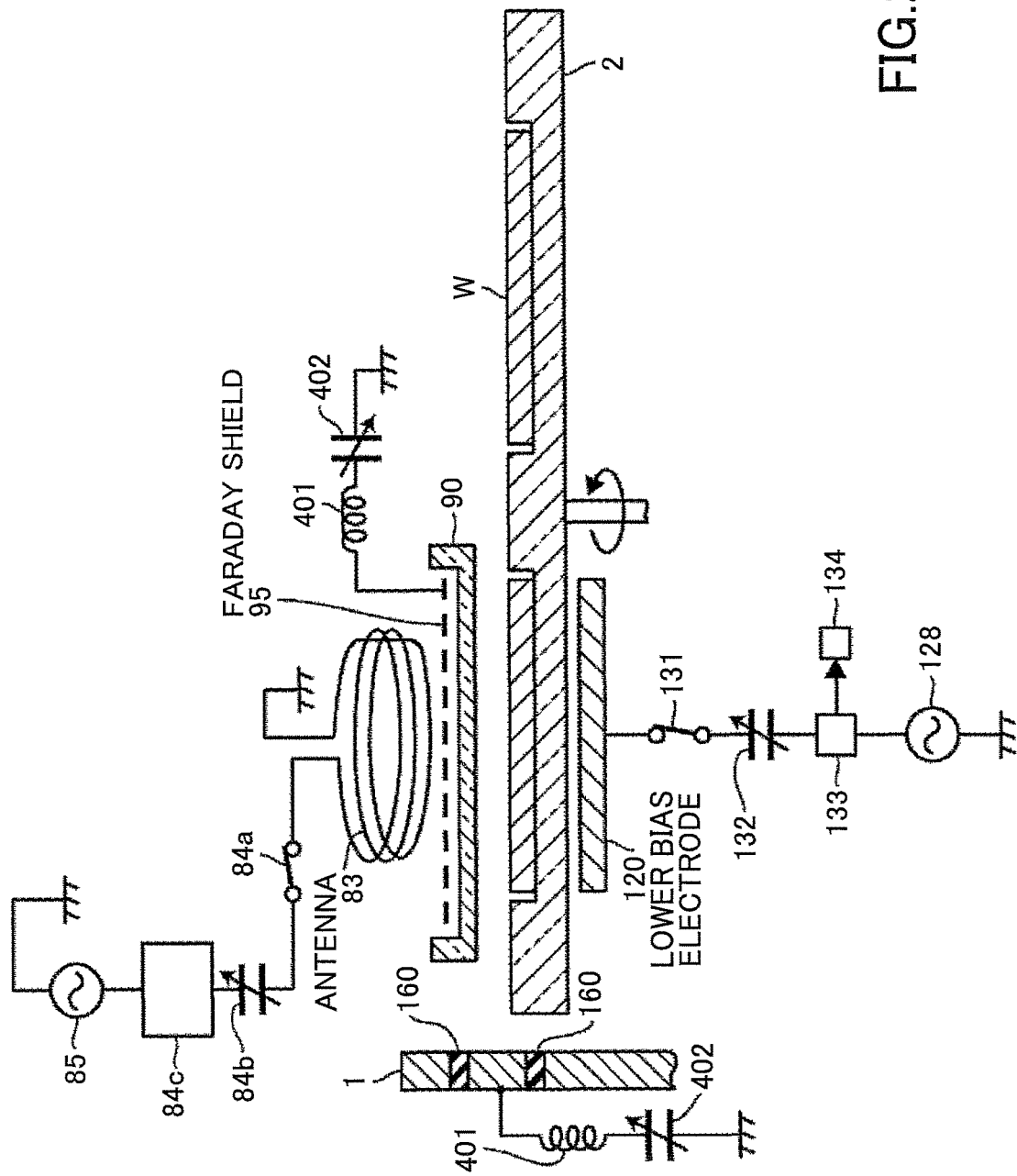
FIG. 20 is a longitudinal sectional view that illustrates a part of another example of the film formation device.

Moreover, as illustrated in FIG. 20, an inner wall surface of the vacuum chamber 1 and the Faraday shield 95 may also be utilized as electrodes that oppose the lower bias electrode 120. That is, the vacuum chamber 1 is composed of an electrically conductive material of, for example, aluminum or the like and an inner wall surface of the vacuum chamber 1 is close to an outer peripheral surface of the rotating table. Therefore, the inner wall surface as well as the Faraday shield 95 may be utilized as an upper bias electrode that opposes the lower bias electrode 120. The bias drawing circuit 402 is connected to each of an inner wall of the vacuum chamber 1 and the Faraday shield 95. In FIG. 20, 160 indicates a ring-shaped insulation member formed to surround an inner wall surface adjacent to the bias space S3 in order to insulate between the inner wall surface and another inner wall surface of the vacuum chamber 1. That is, the insulation member 160 is provided in such a manner that only an inner wall surface facing the bias space S3 among inner wall surfaces of the vacuum chamber 1 is an upper bias electrode.

Figure 21:
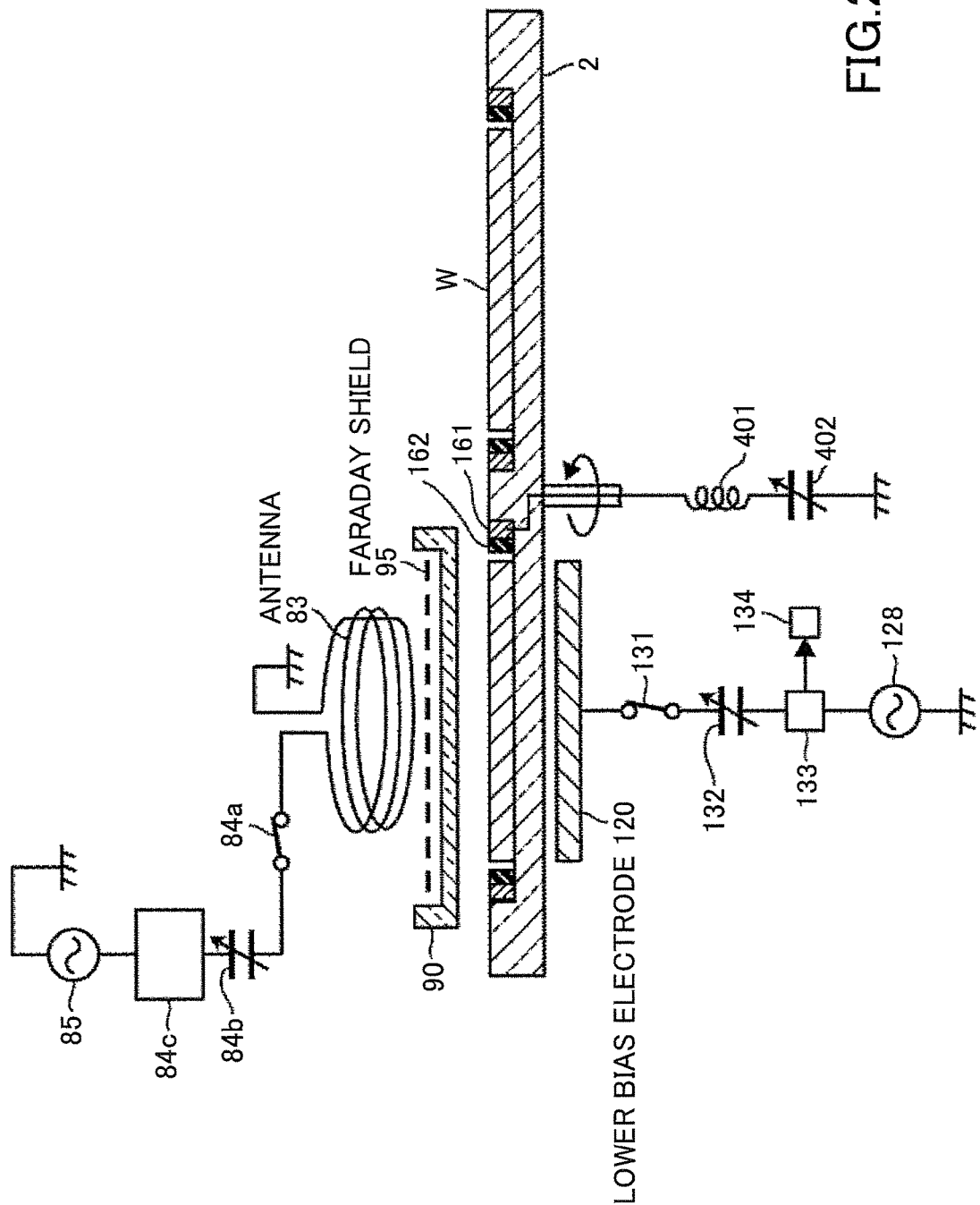
FIG. 21 is a longitudinal sectional view that schematically illustrates another example of the film formation device.
Figure 22:
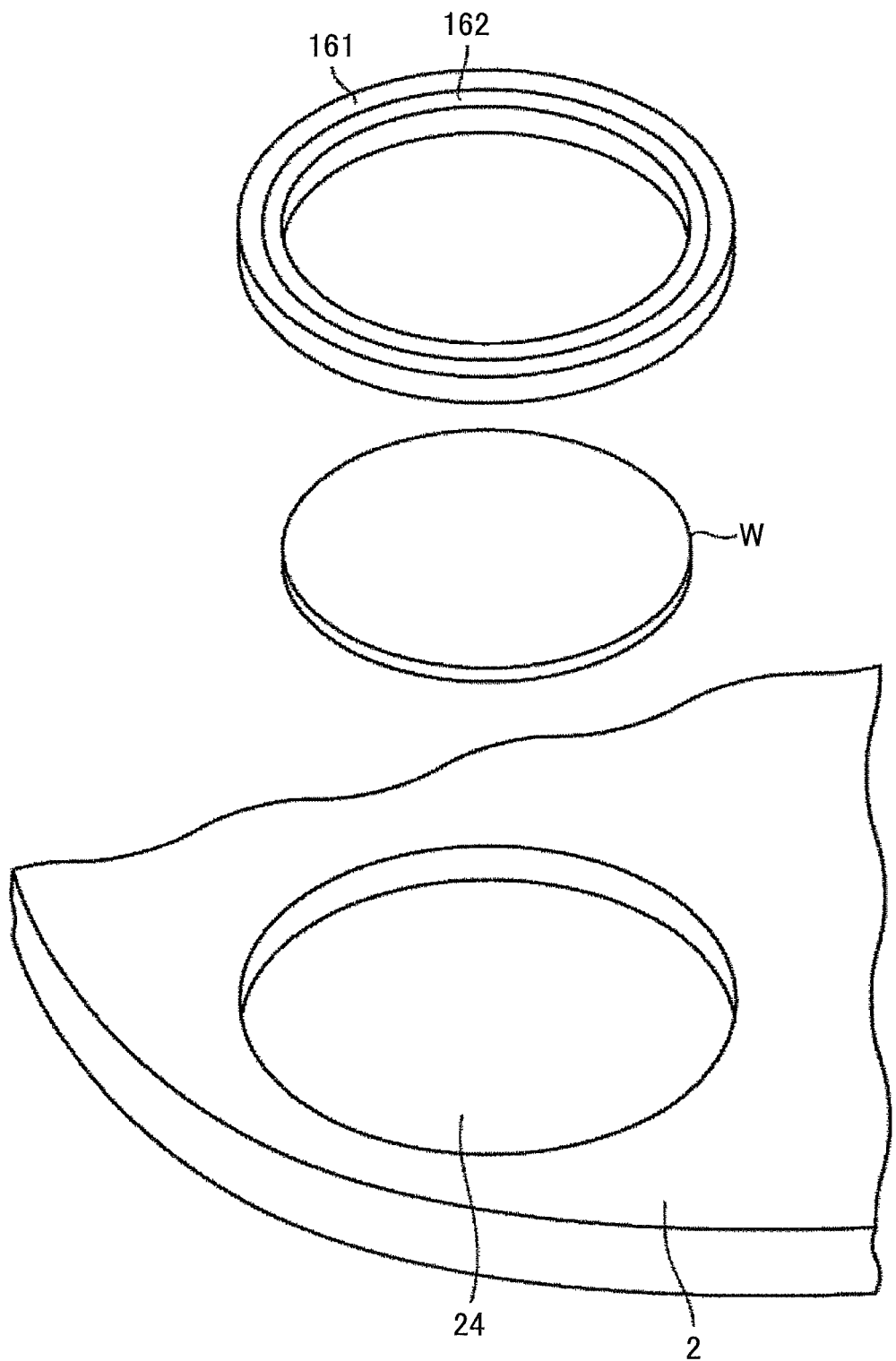
FIG. 22 is a perspective view that illustrates a part of another example of the film formation device.

Moreover, an upper bias electrode may be provided at a height or position identical to that of a wafer W on the rotating table 2 instead of being provided at an upper side with respect to a height or position of the wafer W on the rotating table 2 (the Faraday shield 95 or an inner wall surface of the vacuum chamber 1). Specifically, as illustrated in FIG. 21, a focus ring 161 that is composed of a ring-shaped electrically conductive material to surround a wafer W in a peripheral direction may be arranged on the rotating table 2 to utilize the focus ring 161 as the electrode. The focus ring 161 is connected to the bias drawing circuit 402 through, for example, an electrically conductive path that is laid inside of the rotating shaft 22 and is not illustrated in the figures. In FIG. 21, 162 indicates a ring member that is composed of an insulator for insulating between a wafer W and the focus ring 161 or space gap and arranged on the rotating table 2 together with the focus ring 161 and the wafer W, as illustrate in FIG. 22.

Even in a case where the focus ring 161 is provided, an electric field is formed that is directed from a top surface of the focus ring 161 through an arrangement area for a wafer W to the lower bias electrode 120 so that an ion in plasma is similarly attracted to the wafer W. Here, in addition to the above electric field, another electric field is also formed that is directed from a bottom surface of the focus ring 161 to the lower bias electrode 120 directly.

Even in a case where such a focus ring 161 is provided, a configuration may be provided like FIG. 15 to FIG. 19 as already described, or the Faraday shield 95 or an inner wall surface of the vacuum chamber 1 as well as the focus ring 161 may be utilized as an upper bias electrode. Here, a wafer W and the focus ring 161 may be contacted mutually and directly without providing the ring member 162.

Figure 23:
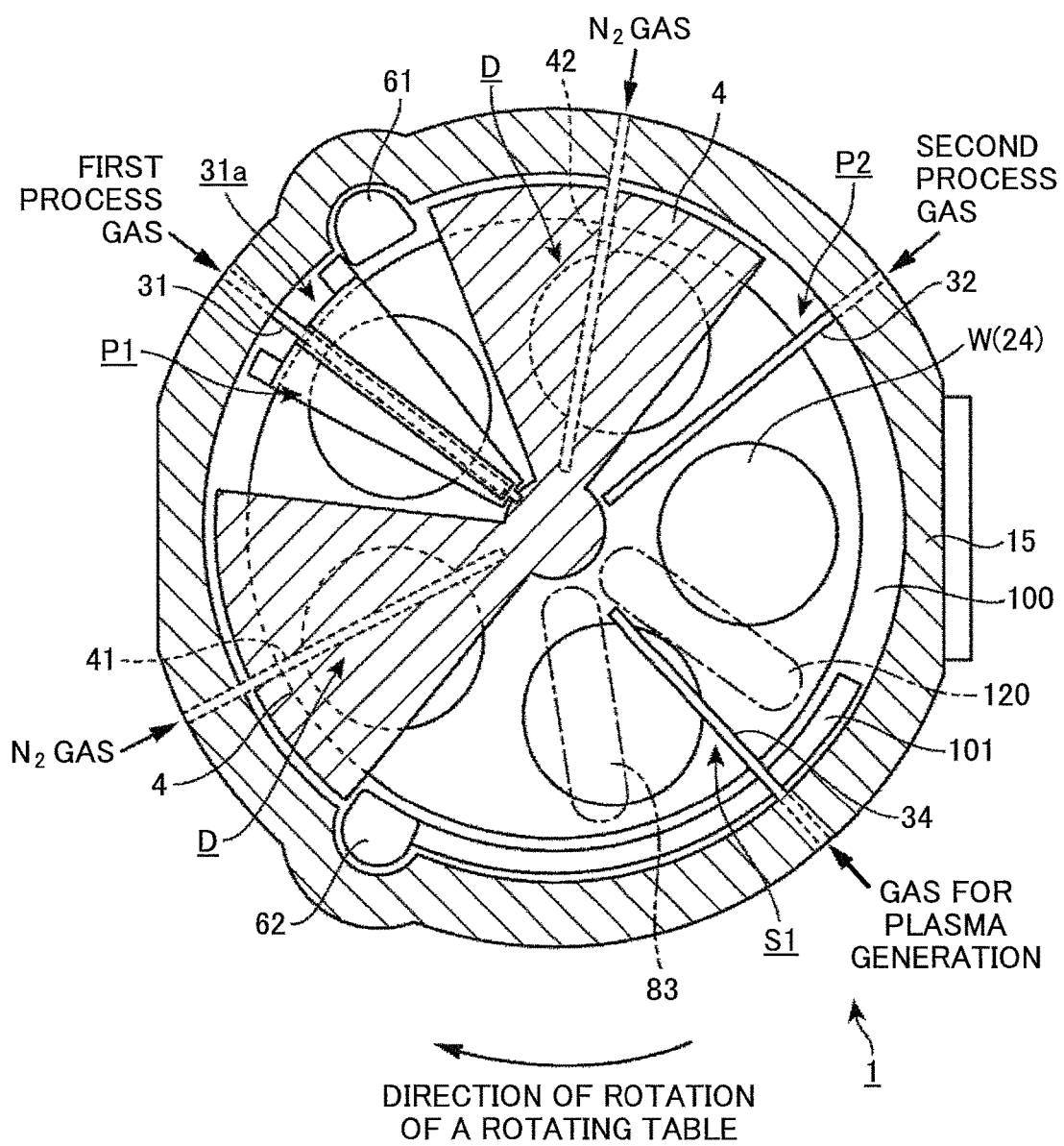
FIG. 23 is a transverse sectional plan view that illustrates another example of the film formation device.

Furthermore, although the lower bias electrode 120 is arranged at a lower side of the antenna 83, the lower bias electrode 120 may be shifted with respect to the antenna 83, for example, to a upstream side of the direction of rotation, as illustrated in FIG. 23, for example, in a case where a distribution of plasma is adjusted in a direction of rotation of the rotating table 2.

To summarize the above-mentioned matters, the lower bias electrode 120 is provided at a lower side of a height or position of a wafer W on the rotating table 2. On the other hand, an electrode that opposes the lower bias electrode 120 is provided at a position identical to a height of a wafer W on the rotating table 2 (the focus ring 161) or an upper side of the height or position (the Faraday shield 95 or an inner wall surface of the vacuum chamber 1). Then, the lower bias electrode 120 and an electrode that opposes the lower bias electrode 120 may not be arranged at a position for overlapping with the modification area 51 when each of them are viewed in a plane. Furthermore, the lower bias electrode 120 may be configured to be inserted into an interior of the rotating table 2, and for example, the rotating table 2, the rotating shaft 22, or the like is composed of an electrically conductive material wherein a power is supplied to the rotating shaft 22 through, for example, a slip ring mechanism that is not illustrated in the figures. Moreover, although the antenna 83 is such that a terminal at a side of one end is connected to the high-frequency power source 85 and a terminal at a side of the other end is grounded, each of such a side of one end and a side of the other end may be connected to the high-frequency power source 85. Furthermore, the antenna 83 may be such that a terminal at a side of one end is connected to the high-frequency power source 85 and a terminal at a side of the other end may be on a float condition (be supported on a condition of floating from a peripheral electrically conductive part).

Figure 24:
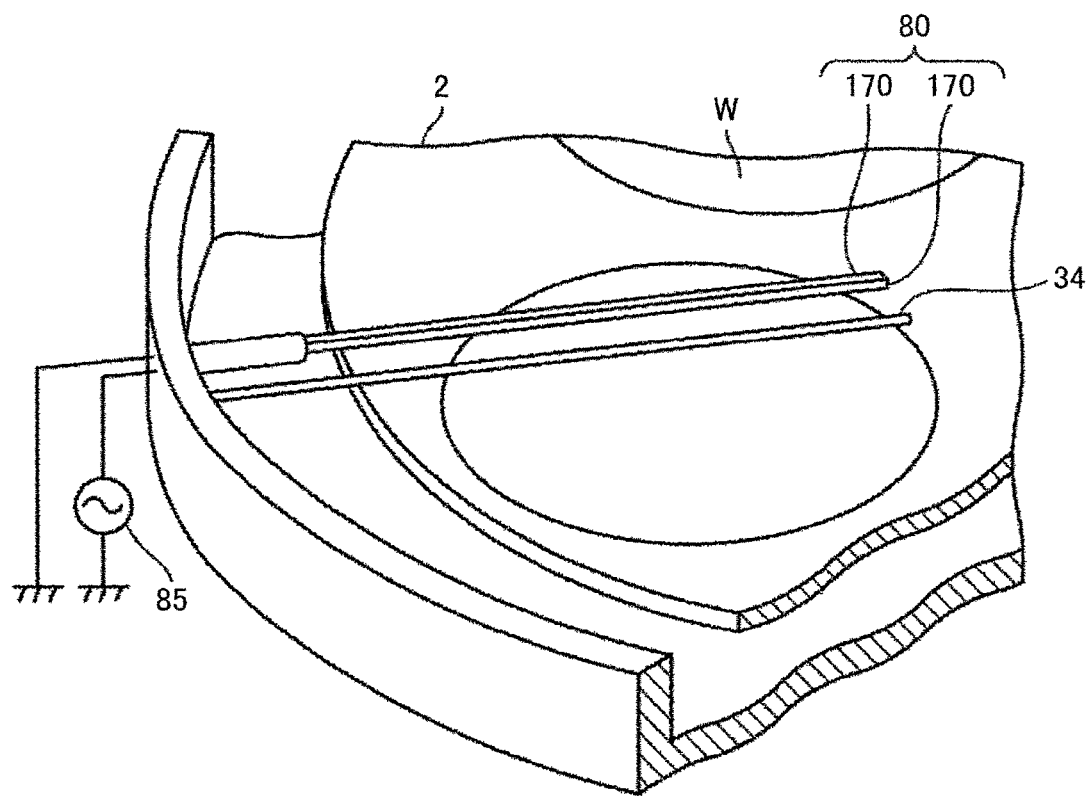
FIG. 24 is a perspective view that illustrates another example of the film formation device.
Figure 25:
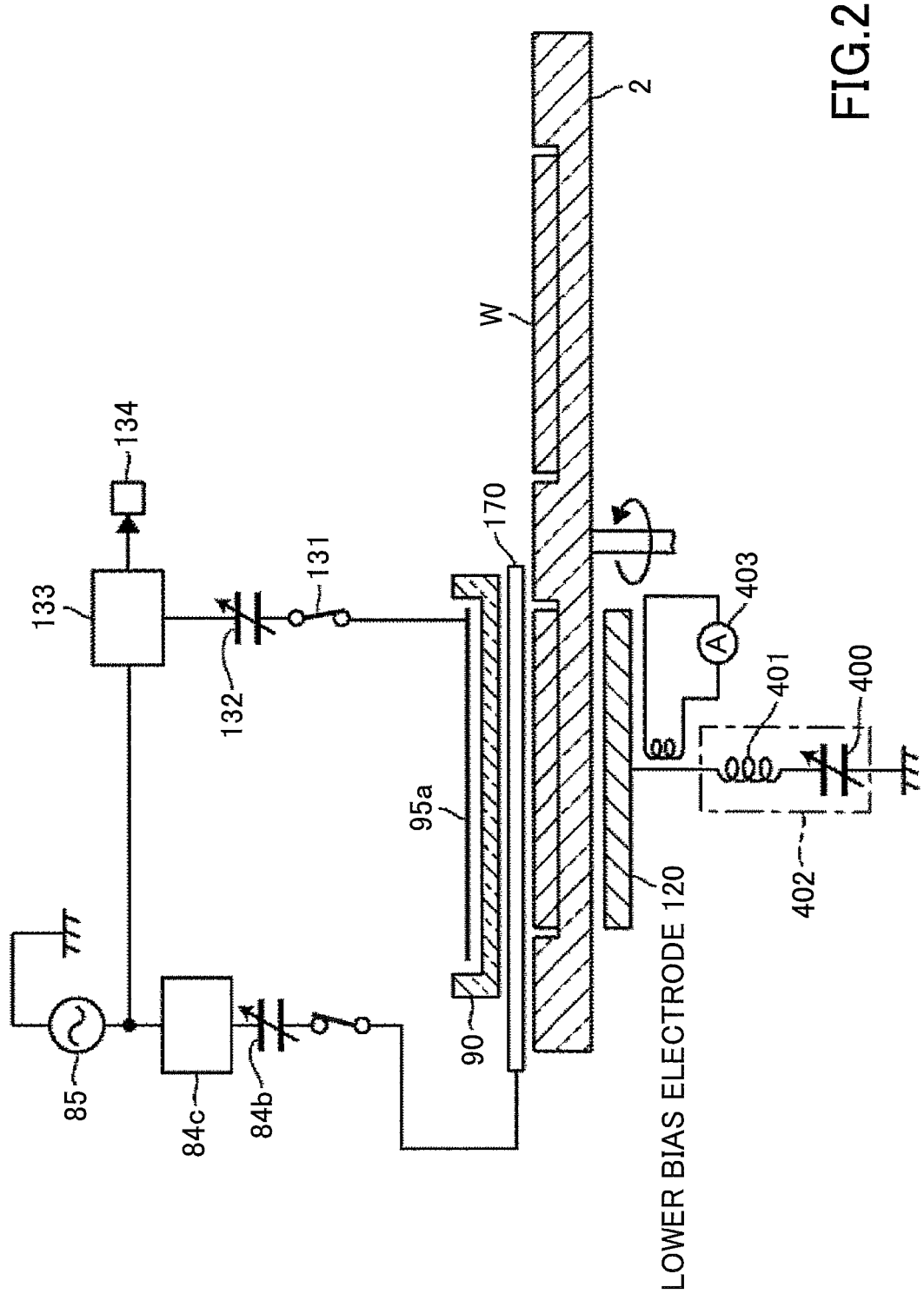
FIG. 25 is a longitudinal sectional view that schematically illustrates another example of the film formation device.

Moreover, although inductive coupled plasma (ICP) is generated by winding the antenna 83 as the plasma processing part 80 in each example as described above, capacitance coupled plasma (CCP) may also be generated. In this case, as illustrated in FIG. 24, a pair of opposite electrodes 170 and 171 are arranged at a downstream side of a direction of rotation of the rotating table 2 with respect to the gas-for-plasma-generation nozzle 34. Then, as illustrated in FIG. 25, one opposite electrode 170 among these opposite electrodes 170 is connected to the high-frequency power source 85 as already described while the other opposite electrode 170 is grounded. In FIG. 25, this high-frequency power source 85 is utilized a high-frequency power source for bias, that is, is common to a high-frequency power source for plasma generation, and is connected to an upper bias electrode. Then, this upper bias electrode uses, for example, a disk-shaped electrode plate 171, instead of the Faraday shield 95.

In a case where plasma formation of a gas for plasma generation is thus conducted by capacitance coupled plasma, a high frequency power may be applied between the lower bias electrode 120 and an upper bias electrode (Faraday shield 95 or an electrode plate 171). Alternatively, a dedicated pair of opposite electrodes for plasma generation may be provided to be adjacent to each of such a lower bias electrode 120 and upper bias electrode.

Furthermore, the lower bias electrode 120 may be arranged outside the vacuum chamber 1 (at a lower side of a bottom surface part of the vacuum chamber 1).

For a first process gas used for film-forming a silicon oxide film as described above, the following compound in Table 1 may be used. Here, in each of the following tables, a "raw material "A" area" indicated a first processing area P1 and a "raw material "B" area" indicates a second processing area 22. Furthermore, each of the following gasses is one example, and the gas as already described is also described in combination.

TABLE 1

RAW MATERIAL "A" AREA
INSULATION LAYER FORMATION MATERIAL dichlorosilane (DCS), tetraethoxysilane (TEOS),
tetramethylsilane (TMS), hexachlorodisilane (HCD),
monosilane ($SiH_4$), disilane ($Si_2H_6$), hexamethyldisilane
(HMDS), trichlorosilane (TCS), disilylamine (DSA),
trisilylamine (TSA), bistertiarybutylaminosilane (BTBAS),
trisdimethylaminosilane (3DMAS),
tetrakisdimethylaminosilane (4DMAS),
trisethylmethylaminosilane (TEMASiH),
tetrakismethoxymethylpropoxysilane ($Si(MMP)_4$)

Furthermore, a compound in Table 2 may be used for a second process gas for oxidizing a first process gas in Table 1.

TABLE 2

RAW MATERIAL "B" AREA
OXIDATION SPECIES oxygen ($O_2$), ozone ($O_3$)
water ($H_2O$)
plasma + $O_2$
plasma + $O_3$ Here, "plasma+$O_2$" or "plasma+$O_3$" in this Table 2 means that, for example, the plasma processing part 80 as already described is provided at an upper side of the second process gas nozzle 32 and plasma formation of such oxygen gas or ozone gas is conducted to be used.

Furthermore, a silicon nitride film (SiN film) may be formed by using the compound in Table 1 as already described for a first process gas and using a gas composed of a compound in Table 3 for a second process gas.

TABLE 3

RAW MATERIAL "B" AREA
NITRIZATION SPECIES ammonia ($NH_3$)
nitrogen ($N_2$)
plasma + $NH_3$
plasma + $N_2$ Here, "plasma" in this Table 3 also means that plasma formation of each gas following a term of "plasma" is conducted to be used similarly to Table 2.

Moreover, a gas composed of a compound in Table 4 may be used for each of a first process gas and a second process gas to film-form a silicon carbide (SiC) film.

TABLE 4

| RAW MATERIAL "A" AREA SIDE SiC FILM FORMATION MATERIAL (FIRST PROCESS GAS) | RAW MATERIAL "B AREA CARBON SPECIES (SECOND PROCESS GAS) |
|---|---|
| $SiH_4$, $Si_2H_6$, tetrachlorosilane ($SiCl_4$), trichlorosilane ($SiHCl_3$), dichlorosilane ($SiH_2Cl_2$) | propane ($C_3H_8$), ethylene ($C_2H_4$), acetylene ($C_2H_2$), ethane ($C_2H_6$) |

Moreover, a silicon film (Si film) may also be film-formed by using a first process gas in Table 4 as provided above. That is, in this case, the second process gas nozzle 32 is not provided and a wafer W on the rotating table 2 alternately passes through a first processing area (film formation area) P1 and a modification area S1 via a separation area D. Then, as a first process gas component is adsorbed on a surface of a wafer W in a first processing area P1 to form a adsorption layer 300, thermal decomposition of the adsorption layer 300 is caused on a surface of the wafer W due to heat of the heater unit 7 during rotation on the rotating table 2 so that an impurity such as hydrogen or chlorine is eliminated. Therefore, a reaction layer 301 is formed by thermal decomposition reaction of the adsorption layer 300.

However, because the rotating table 2 rotates around a vertical axis, a period of time after a wafer W on the rotating table 2 has passed through the first processing area P1 and until it reaches the modification area S1, that is, a period of time for emitting from an impurity from the adsorption layer 300, is very short. Accordingly, an impurity is still contained in the reaction layer 301 of a wafer W just before it reaches the modification area S1. Accordingly, it is possible to eliminate an impurity from the reaction layer 301 and obtain a reaction layer 301 with a better film quality, by supplying, for example, argon gas plasma to a wafer W in the modification area S1. Thus, it passes through the areas P1 and P2 alternately, so that a number of reaction layers 301 are laminated to film-form a silicon film. Therefore, "plasma modification processing" in an embodiment of the present invention also includes a process for reacting the adsorption layer 300 (thermal decomposition reaction) as well as a process for eliminating an impurity from the reaction layer 301 and conducting modification of the reaction layer 301.

For a gas for plasma generation to be used in plasma processing for a silicon film, a gas for generating plasma that provides a wafer W with energy of an ion is used, and specifically, a rare gas such as helium (He) gas, hydrogen gas, or the like is used other than argon gas as already described.

Furthermore, in a case where a silicon film is formed, the silicon film may be doped with boron (B) or phosphorus (P) by using a dope material in Table 5 as a second process gas.

TABLE 5

| RAW MATERIAL "B" AREA Si DOPE MATERIAL |
|---|
| phosphine ($PH_3$), diborane ($B_2H_6$), $BCl_3$ |

Furthermore, a metal oxide film, a metal nitride film, a metal carbide film, or a high-k film (high dielectric film) may be formed by using a gas composed of the following compound illustrated in Table 6 as a first process gas and using a second process gas as already described.

TABLE 6

| RAW MATERIAL "A" AREA METAL LAYER FORMATION MATERIAL |
|---|
| trimethylaluminum (TMA), hexafluoroacetylacetonato-trimethylvinylsilylcopper (Cu(hfac)TMVS), Cu(EDMDD)$_2$, tertiarybutylimido-tri-diethylamidotantalum (TBTDET), pentaethoxytantalum (PET), titanium chloride (tiCl$_4$), aluminum chloride (AlCl$_3$), tetrakisethoxyhafnium (TEH), Zr(OtBt)$_4$, hafnium tetratertiarybutoxide (HTTB), tetrakisdimethylaminohafnium (TDMAH), tetrakisdiethylaminohafnium (TDEAH), tetrakisethylmethylaminohafnium (TEMAH), tetrakismethoxymethylpropoxyhafnium (Hf(MMP)$_4$), zirconium tetratertiarybutoxide (ZTTB), tetrakisdimethylaminozirconium (TDMAZ), tetrakisdiethylaminozirconium (TDEAZ), tetrakisethylmethylaminozirconium (TEMAZ), tetrakismethoxymethylpropoxyzirconium (Zr(MMP)$_4$), tetraethylaluminum (TEA), trismethoxymethylpropoxyaluminum (Al(MMP)$_3$) |

Furthermore, plasma of a gas composed of the following compound in Table 7 may be used as a gas for plasma modification or a plasma ion injection gas to be used together with the gas for plasma modification.

TABLE 7

| PLASMA AREA SIDE PLASMA MODIFICATION GAS, PLASMA ION INJECTION GAS |
|---|
| $O_2$ plasma, Ar plasma, He plasma, $H_2$ plasma, $N_2$ plasma, $NH_3$ plasma, $H_2O$ plasma, $CH_4$ plasma $N_2O$ plasma, $CO_2$ plasma |

Here, in this Table 7, plasma that contains an oxygen (O) element, plasma that contains a nitrogen (N) element, and plasma that contains a carbon (C) element may be used for only processes for film-forming an oxide film, a nitride film, and a carbide film, respectively.

Furthermore, although a plasma modification process as described above is conducted for each rotation of the rotating table 2, that is, for each film formation of the reaction layer 301, it may be conducted for each lamination of, for example, 10 to 100 reaction layers 301. In this case, after supply of power to the plasma high-frequency power sources 85 and 128 is stopped at a time of start of film formation and the rotating table 2 is rotated by the number of laminated reaction layers 301, supply of a gas to the nozzles 31 and 32 is stopped and a power is supplied to these plasma high frequency power sources 85 and 128 to conduct plasma modification. Subsequently, lamination of reaction layers 301 and plasma modification are repeated again.

Moreover, a plasma modification process may also be conducted for a wafer W already having a thin film formed thereon. In this case, while each of the gas nozzles 31, 32, 41, and 42 is not provided in the vacuum chamber 1, the gas-for-plasma-generation nozzle 34, the rotating table 2, the lower bias electrode 120, and the like are arranged. Even in a case where only a plasma modification process is thus conducted in the vacuum chamber 1, it is possible to attract plasma (ion) into the recess 10 due to the bias space S3, and hence, it is possible to conduct a uniform plasma modification process in a direction of a depth of the recess 10.

Moreover, activation of a process gas may also be conducted as plasma processing to be conducted for a wafer W, instead of a modification process. Specifically, the plasma processing part 80 may be combined with the second process gas nozzle 32 as already described and the lower bias electrode 120 may be arranged at a lower side of the nozzle 32. In this case, a process gas (oxygen gas) ejected from the nozzle 32 is activated by the plasma processing part 80 to produce plasma and this plasma is attracted to a side of a wafer W. Therefore, it is possible to homogenize a film thickness or film quality of the reaction layer 301 in a direction of a depth of the recess 10.

Even in a case where plasma formation of a process gas is thus conducted, the plasma modification process as already described may be conducted together with the plasma formation of a process gas. Furthermore, a specific process for conducting plasma formation of a process gas may also be applied to, for example, a Si—N (silicon nitride) type thin film other than the film formation of a Si—O type thin film as already described. In a case where this Si—N type thin film is film-formed, a gas containing nitrogen (N), for example ammonia ($NH_3$) gas, is used as a second process gas.

[Appendix]

Appendix (1):

A film formation device for conducting a film formation process for a substrate in a vacuum chamber, wherein the film formation device is characterized by including:

a rotating table for revolving a substrate mounting area that mounts a substrate;

a film formation area that includes a process gas supply part that supplies a process gas to the substrate mounting area and is to sequentially laminate a molecular layer or an atomic layer on a substrate with rotation of the rotating table to form a thin film;

a plasma processing part for modification-processing the molecular layer or the atomic layer by plasma produced through plasma formation of a gas for plasma generation in a plasma generation area provided separately from this film formation area in a direction of rotation of the rotating table;

a lower bias electrode provided at a lower side of a position of a height of a substrate on the rotating table to attract an ion in plasma to a surface of a substrate and an upper bias electrode arranged at the same position of the height or an upper side of a position of the height;

a high-frequency power source part connected to at least one of these bias electrodes and being to form a bias electric potential on a substrate in such a manner that the lower bias electrode and the upper bias electrode are capacitively coupled through the plasma generation area; and an exhaust mechanism for exhausting a gas in an inside of the vacuum chamber.

Appendix (2):

The film formation device as described in Appendix (1), characterized in that:

the plasma processing part includes an antenna winding around a vertical axis and connected to a high-frequency power source for plasma generation to generate inductively coupled plasma in a plasma generation area, and the upper bias electrode is provided between the antenna and the plasma generation area and is an electrically conductive plate wherein a plurality of slits formed to intersect a direction of extending of the antenna are arranged along a direction of a length of an antenna to block an electric field of an electromagnetic field formed by the antenna and pass a magnetic field thereof.

Appendix (3): The film formation device as described in Appendix (1) or (2), characterized in that each of the lower bias electrode and the upper bias electrode is arranged through a gap area for a substrate on the rotating table.

Appendix (4):

The film formation device as described in any one of Appendices (1) to (3), characterized by including:

another process gas supply part provided at a position separated from the process gas supply part in a direction of rotation of a rotating table and being to supply a gas reactive with a process gas supplied from the process gas supply part; and a separation gas supply part for supplying a separation gas to each separation area provided between these processing areas to mutually separate the processing areas supplied with a gas from each of the process gas supply part and the another process gas supply part.

Appendix (5):

The film formation device as described in Appendix (1), characterized in that the plasma processing part includes a high-frequency power source for plasma generation for conducting plasma formation of a gas for plasma generation and this high-frequency power source for plasma generation is doubled as the high-frequency power source part.

Appendix (6): The film formation device as described in Appendix (5), characterized in that the plasma processing part includes a pair of opposite electrodes arranged to oppose each other to generate capacitively coupled plasma in the plasma generation area.

Appendix (7):

A substrate processing device, characterized by including:

a rotating table provided in a vacuum chamber to revolve a substrate mounting area that mounts a substrate thereon;

a plasma processing part for supplying plasma produced through plasma formation of a gas for plasma generation to the substrate mounting area to conduct plasma processing for a substrate in a plasma generation area;

a lower bias electrode provided at a lower side of a position of a height of a substrate on the rotating table to attract an ion in plasma on a surface of a substrate and an upper bias electrode arranged at the same position of the height or at an upper side of a position of the height;

a high-frequency power source part connected to at least one of these bias electrodes and being to form a bias electric potential on a substrate in such a manner that the lower bias electrode and the upper bias electrode are capacitively coupled through the plasma generation area; and an exhaust mechanism for exhausting a gas in an inside of the vacuum chamber.

Appendix (8): A film formation method for conducting a film formation process for a substrate in a vacuum chamber, wherein the film formation method is characterized by including:

a step that mounts a substrate with a recess formed on a surface thereof in a substrate mounting area on a rotating table and revolves this substrate mounting area;

a step that then supplies a process gas for a substrate in the substrate mounting area to film-form a molecular layer or an atomic layer on the substrate;

a step that subsequently supplies a gas for plasma generation in a plasma generation area in the vacuum chamber and conducts plasma formation of this gas for plasma generation to conduct a modification process for the molecular layer or the atomic layer by plasma;

a step that supplies a power to at least one of a lower bias electrode provided at a lower side of a position of a height of a substrate on the rotating table and an upper bias electrode arranged at the same position of the height or an upper side of a position of the height to capacitively couple the lower bias electrode and the upper bias electrode through the plasma generation area, thereby forming a bias electric potential on a substrate, and attract an ion in plasma on a surface of the substrate; and a step that exhausts a gas in an inside of the vacuum chamber.

What is claimed is:

1. A film formation device configured to conduct a film formation process for a substrate in a vacuum chamber, comprising:
    a rotating table configured to revolve a substrate mounting area configured to mount the substrate thereon;
    a film formation area configured to include a process gas supply part configured to supply a process gas to the substrate mounting area and sequentially laminate a molecular layer or an atomic layer on the substrate with rotation of the rotating table to form a thin film;
    a plasma processing part configured to conduct modification processing on the molecular layer or the atomic layer by plasma produced through plasma formation of a gas for plasma generation in a plasma generation area provided separately from the film formation area in a direction of rotation of the rotating table, the plasma processing part including an antenna winding around a vertical axis and connected to a high-frequency power source for plasma generation to generate inductively coupled plasma in the plasma generation area and having an octagon shape that extends in a radial direction of the rotating table;
    a lower bias electrode provided at a lower side of a position of a height of the substrate on the rotating table to attract an ion in the plasma to a surface of the substrate;
    an upper bias electrode arranged at the same position of the height or an upper side of a position of the height and having a box shape with an opening at a top portion thereof and a plurality of slits provided only at a bottom thereof surface that is arranged so as to be parallel to the rotating table, said plurality of slits extending in directions perpendicular to a winding direction of the antenna;
    a high-frequency power source part connected to at least one of the lower bias electrode and the upper bias electrode and configured to form a bias electric potential on the substrate in such a manner that the lower bias electrode and the upper bias electrode are capacitively coupled through the plasma generation area; and
    an exhaust mechanism configured to exhaust a gas in an inside of the vacuum chamber,
    wherein the lower bias electrode is provided away from a bottom surface of the rotating table in a direction away from the upper bias electrode.

2. The film formation device as claimed in claim 1, wherein the upper bias electrode is provided between the antenna and the plasma generation area and is an electrically conductive plate wherein the plurality of slits formed to intersect a direction of extending of the antenna are arranged along a direction of a length of the antenna to block an electric field of an electromagnetic field formed by the antenna and pass a magnetic field thereof.

3. The film formation device as claimed in claim 1, further comprising:
    another process gas supply part provided at a position separated from the process gas supply part in a direction of rotation of the rotating table and configured to supply a gas reactive with the process gas supplied from the process gas supply part; and
    a separation gas supply part configured to supply a separation gas to a separation area provided between processing areas to mutually separate the processing areas supplied with a gas from each of the process gas supply part and the another process gas supply part.

4. The film formation device as claimed in claim 1, wherein there is provided a space between the bottom surface of the rotating table and the lower bias electrode.

5. The film formation device as claimed in claim 1, wherein the plasma processing part further includes an insulating plate provided between the antenna and the bottom surface having the plurality of slits.

6. The film formation device as claimed in claim 1, wherein the plurality of slits are aligned in a direction along with the octagon shape of the antenna and arranged so as to face the turning table.

7. The film formation device as claimed in claim 1, wherein the plurality of slits are formed by penetrating through the bottom surface of the upper bias electrode in a direction of an axis of the rotating table.

8. A substrate processing device, comprising:
    a rotating table provided in a vacuum chamber to revolve a substrate mounting area configured to mount a substrate thereon;
    a plasma processing part configured to supply plasma produced through plasma formation of a gas for plasma generation to the substrate mounting area to conduct plasma processing for the substrate in a plasma generation area, the plasma processing part including an antenna winding around a vertical axis and connected to a high-frequency power source for plasma generation to generate inductively coupled plasma in the plasma generation area and having an octagon shape that extends in a radial direction of the rotating table;
    a lower bias electrode provided at a lower side of a position of a height of the substrate on the rotating table to attract an ion in the plasma on a surface of the substrate;
    an upper bias electrode arranged at the same position of the height or at an upper side of a position of the height and having a box shape with an opening at a top portion thereof and a plurality of slits provided only at a bottom surface thereof that is arranged so as to be parallel to the rotating table, said plurality of slits extending in directions perpendicular to a winding direction of the antenna;
    a high-frequency power source part connected to at least one of the lower bias electrode and the upper bias electrode and configured to form a bias electric potential on the substrate in such a manner that the lower bias electrode and the upper bias electrode are capacitively coupled through the plasma generation area; and
    an exhaust mechanism configured to exhaust a gas in an inside of the vacuum Chamber,
    wherein the lower bias electrode is provided away from a bottom surface of the rotating table in a direction away from the upper bias electrode.

9. The film formation method as claimed in claim 7, wherein there is provided a space between the bottom surface of the rotating table and the lower bias electrode.

* * * * *